(12) United States Patent
Janvier

(10) Patent No.: US 9,449,430 B2
(45) Date of Patent: Sep. 20, 2016

(54) GEOMETRICAL ELEMENTS TRANSFORMED BY RIGID MOTIONS

(71) Applicant: DASSAULT SYSTEMES, Velizy Villacoublay (FR)

(72) Inventor: Jean-Baptiste Janvier, Provins (FR)

(73) Assignee: Dassault Systemes, Velizy Villacoublay (FR)

( * ) Notice: Subject to any disclaimer, the term of this patent is extended or adjusted under 35 U.S.C. 154(b) by 176 days.

(21) Appl. No.: 14/139,717

(22) Filed: Dec. 23, 2013

(65) Prior Publication Data

US 2014/0184594 A1     Jul. 3, 2014

(30) Foreign Application Priority Data

Dec. 31, 2012   (EP) ..................................... 12306721

(51) Int. Cl.
*G06T 17/00*     (2006.01)
*G06F 17/50*     (2006.01)

(52) U.S. Cl.
CPC ............. *G06T 17/005* (2013.01); *G06F 17/50* (2013.01); *G06F 17/509* (2013.01); *G06T 2210/61* (2013.01)

(58) Field of Classification Search
CPC ................... G06T 17/10; G06T 17/00; G06T 2219/2008; G06F 17/50; G06F 17/30958; G06K 9/44; G06K 9/6892; G06K 9/0014; G06K 9/00248; G06K 9/469
USPC .................................... 345/420, 419; 706/59
See application file for complete search history.

(56) References Cited

U.S. PATENT DOCUMENTS

| | | | |
|---|---|---|---|
| 6,721,614 B2 | 4/2004 | Duncan et al. | |
| 6,768,928 B1 | 7/2004 | Nagasawa et al. | |
| 7,269,808 B2 | 9/2007 | Bruce et al. | |
| 7,733,340 B1 | 6/2010 | Desimone et al. | |
| 2002/0008700 A1 | 1/2002 | Fuki | |
| 2002/0095276 A1* | 7/2002 | Rong | G06T 17/00 703/2 |

(Continued)

FOREIGN PATENT DOCUMENTS

| | | |
|---|---|---|
| EP | 0646884 A2 | 4/1995 |
| EP | 0 964 364 A2 | 12/1999 |

(Continued)

OTHER PUBLICATIONS

Author: Lujie Ma, et al. Title: Automatic discovery of common design structures in CAD models; Publisher: Computer & Graphics 34 (2010) 545-555.*

(Continued)

*Primary Examiner* — Zhengxi Liu
*Assistant Examiner* — Yanna Wu
(74) *Attorney, Agent, or Firm* — Hamilton, Brook, Smith & Reynolds, P.C.

(57) ABSTRACT

It is provided a computer-implemented method for designing a three-dimensional modeled object. The method comprises providing geometrical elements that represent the modeled object and that include a set in which the geometrical elements are a copy one of another. The method also comprises defining a graph, determining maximal sub-graphs of the graph, and identifying, within the determined sub-graphs, the set of connected components having the highest number of arcs and for which the rigid motions represented by the arcs all respect the identity criterion. Such a method improves the design of a 3D modeled object.

8 Claims, 11 Drawing Sheets

(56) References Cited

U.S. PATENT DOCUMENTS

| | | |
|---|---|---|
| 2009/0182450 A1 | 7/2009 | Goldschmidt |
| 2011/0224813 A1 | 9/2011 | Takatsuka |
| 2014/0188439 A1 | 7/2014 | Rorato |
| 2014/0354636 A1 | 12/2014 | Rorato et al. |

FOREIGN PATENT DOCUMENTS

| | | |
|---|---|---|
| EP | 2 169 567 A2 | 3/2010 |
| EP | 2 387 004 A1 | 11/2011 |
| WO | WO 2004/068300 A2 | 8/2004 |
| WO | WO 2008/094170 A1 | 8/2008 |
| WO | WO 2011/103031 A1 | 8/2011 |
| WO | WO 2015/085435 A1 | 6/2015 |

OTHER PUBLICATIONS

Babic, B., et al., "A Review of Automated Feature Recognition with Rule-Based Pattern Recognition," *Computers in Industry*, 59:321-337 (2008).

Creo™ Parametric Data Sheet, © 2011 Parametric Technology Corporation, available at http://www.creo.uk.com/creo_parametric_mapping.htm, last accessed Mar. 27, 2014.

European Search Report, European Application No. EP 12 30 6720, Dated: Jul. 4, 2013.

European Search Report, European Application No. EP 13 30 5700, Dated: Aug. 14, 2013.

Ismail, N., et al., "Feature Recognition Patterns for Form Features Using Boundary Representation Models," *Int J Adv Manuf Technol*, 20:553-556 (2002).

Kao, C.-Y., et al., "Extraction of 3D Object Features from CAD Boundary Representation Using the Super Relation Graph Method," *IEEE Transactions on Pattern Analysis and Machine Intelligence*, 17(12):1228-1233 (1995).

Pauly, M., et al., "Discovering Structural Regularity in 3D Geometry," *ACM Transactions on Graphics*, 27(3):43:1-43:11 (2008).

Santa-Cruz, D. and Ebrahimi, T., "Compression of Parametric Surfaces for Efficient 3D Model Coding," *VCIP*, 4671:280-291 (2002).

Shih, R., *Parametric Modeling with Creo™ Parametric: An Introduction to Creo™ Parametric 1.0*, SDC Publications © 2011 (table of contents only).

Shikhare, D., et al. "Compression of Large 3D Engineering Models Using Automatic Discovery of Repeating Geometric Features," *National Centre for Software Technology*, 233-240 (2001).

Wang, D., et al., "EQSM: An Efficient High Quality Surface Grid Generation Method Based on Remeshing," *Comput. Methods Appl. Mech. Engrg.*, 195:5621-5633 (2006).

Werghi, N., "Extracting Ordered Patterns from a Triangular Mesh Surface," *IEEE Potentials*, 34-43 (2011).

Bespalov, D. et al., "Local Feature Extraction and Matching Partial Objects", *Computer Aided Design*, 38(9): 1020-1037 (2006).

European Search Report completed May 13, 2013 for European Application No. EP 12306721.

Falcidieno, B. and Giannini, F., "A System for Extracting and Representing Feature Information Driven by the Application Context", *Proceedings IEEE International Conference on Robotics and Automation*, pp. 1672-1678 (Jan. 1, 1990).

3DPartFinder by 3DSemantix—Geometric search engine > Home; http://www.3dpartfinder.com, 2 pages.

Altmeyer, J. et al., "Reuse of Design Objects in CAD Frameworks," IEEE/ACM International Conference on Computer-Aided Design, Digest of Technical Papers, pp. 754-761 (Nov. 6, 1994).

Biasotti, S. et al., "Sub-part correspondence by structural descriptors of 3D shapes," *Computer-Aided Design*, 38(9): 1002-1019 (Sep. 2006).

Brière-Côté, Antoine et al., "Comparing 3D CAD Models: Uses, Methods, Tools and Perspectives," *Computer-Aided Design & Applications*, 9(6): 771-794 (2012).

Clark, D.E.R. et al., "Benchmarking shape signatures against human perceptions of geometric similarity," *Computer-Aided Design*, 38(9): 1038-1051 (Sep. 2006).

Cornelio A. et al., "Integration and Cataloging of Engineering Design Information," *Systems Integration '90*, IEEE Comput., Soc., US, pp. 720-729 (Apr. 23, 1990).

European Search Report, European Application No. EP 10 30 6026, Date of Completion of Search: Feb. 3, 2011, 8 pages.

Fonseca, M.J. et al., "Towards content-based retrieval of technical drawings through high-dimensional indexing," *Computers and Graphics*, 27(1): 61-69 (Feb. 2003).

Funkhouser, T. et al., "Modeling by Example," *ACM Transactions on Graphics*, 23(3): 652-663 (Aug. 1, 2004).

Funkhouser, Thomas et al., "A Search Engine for 3D Models," *ACM Transactions on Graphics*, vol. V, No. N, Oct. 20, 2002, 28 Pages.

Imoru, C.O. et al., "On a Version of the Banach's Fixed Point Theorem," *General Mathematics*, vol. 16, Nr. 1, pp. 25-32 (2008).

Kazhdan, M. et al. "Harmonic 3D Shape Matching," ACM SIGGRAPH Symposium on Computer Animation, p. 191 (Jul. 21, 2002).

Kazhdan, Michael et al., "Rotation Invariant Spherical Harmonic Representation of 3D Shape Descriptors," *Eurographics Symposium on Geometry Processing*, 9 pages (2003).

Lee, K.S. et al., "Framework of an evolutionary design system incorporating design information and history," *Computers in Industry*, 44(3): pp. 205-227 (Apr. 2001).

Maranzana, Roland, "3D Data Mining Part and Information Re-Use in a PLM Context," Proceedings of GT2007, May 14-17, 2013, Montreal, Canada, ASME Paper: GT2007-27966, American Society of Mechanical Engineers, New York, NY, 2007. http://dx.doi.org/10.1115/GT2007-27966, 37 pages (2013).

Papadakis, P. et al, "Efficient 3D shape matching and retrieval using a concrete radialized spherical projection representation," *ScienceDirect*, 40: 2437-2452 (2007).

Munkres, James, R., "Elements of algebraic topology", Addison-Wesley Publishing Company, Inc. (1984).

Daras, P., et al., "A 3D Shape Retrieval Framework Supporting Multimodal Queries", Int J Comput Vis 89: 229-247 (2010).

Yang, M., et al., "A Survey of Shape Feature Extraction Techniques". Peng-Yeng Yin. Pattern Recognition, IN-TECH, pp. 43-90 (2008).

Petre, R.D., "An experimental evaluation of view-based 2D/3D indexing methods", 2010 IEEE 26th Convention of Electrical and Electronics Engineers in Israel, Nov. 2010, Israel. pp. 924-928.

\* cited by examiner

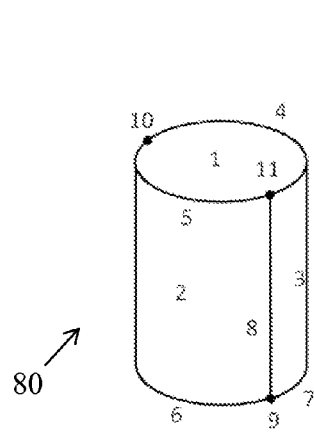
FIG. 4
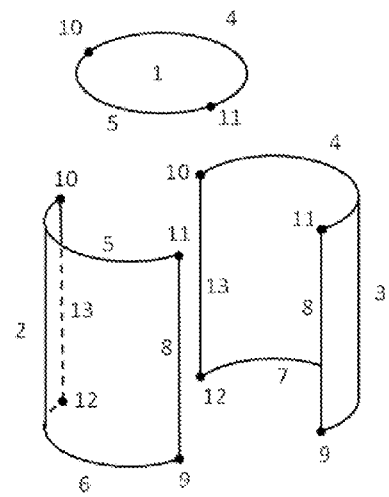
FIG. 5
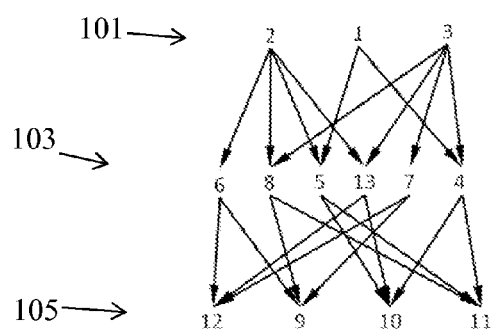
FIG. 6
1 → Plane
2, 3 → Cylindrical surface
4, 5 → Circle 1
6, 7 → Circle 2
8 → Line 1
9 → Point 4
10 → Point 1
11 → Point 2
12 → Point 3
13 → Line 2
FIG. 7
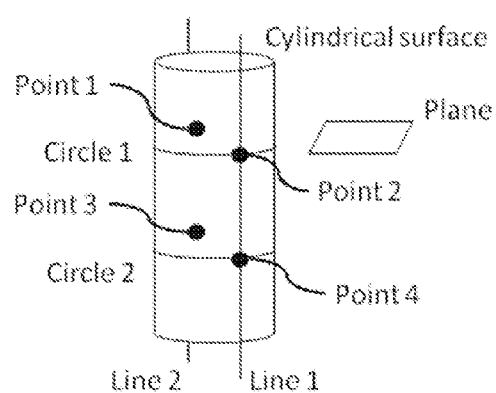
FIG. 8

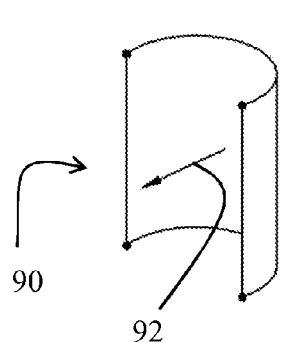 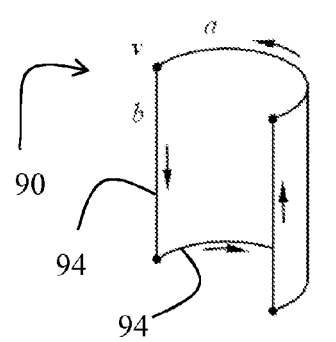 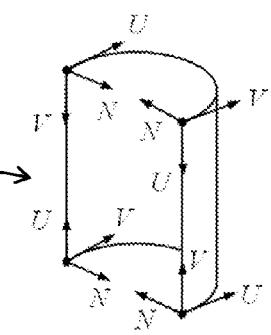
FIG. 9　　　　FIG. 10　　　　FIG. 11
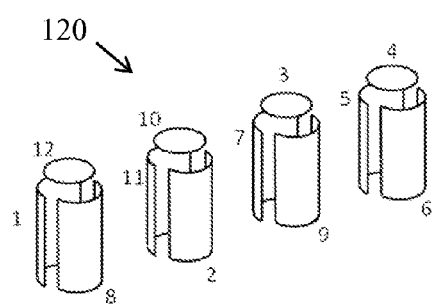 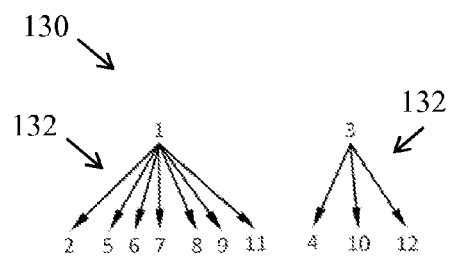
FIG. 12　　　　　　FIG. 13

GEOMETRICAL ELEMENTS TRANSFORMED BY RIGID MOTIONS

RELATED APPLICATION(S)

This application claims priority under 35 U.S.C. §119 or 365 to European Application No. 12306721.7, filed Dec. 31, 2012.

The entire teachings of the above application(s) are incorporated herein by reference.

FIELD OF THE INVENTION

The invention relates to the field of computer programs and systems, and more specifically to a method, system and program for designing a three-dimensional (3D) modeled object.

BACKGROUND OF THE INVENTION

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such systems, the graphical user interface (GUI) plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise.

The PLM solutions provided by Dassault Systemes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Many CAD systems now allow the user to design a 3D modeled object, based on a boundary representation (B-Rep) of the modeled object provided to the user. The B-Rep is a data format comprising a set of faces each defined as a bounded portion of a respective supporting surface. The user can act on the set of faces, by modifying existing faces, creating new faces, deleting some faces, and/or defining constraints on faces and/or between faces, or any actions of the like provided by the CAD system at use. In such a case, for efficiency purposes, the history of the solid is generally not available to the user.

One of the aspects of such 3D design under development is known as "pattern recognition". The term "pattern" refers to regular layouts of copies of the same geometric feature. Recognizing patterns allows the handling of such patterns as a single element during the design, thereby widening the array of design possibilities. For example, instead of modifying the elements of a pattern one by one, thanks to a prior recognition of the pattern, the user may perform modifications of the pattern globally e.g. with single actions. Pattern recognition is relevant in different domains of CAD, such as mechanical design, consumer goods, building architecture, aerospace, or other domains.

Pattern recognition may be related to feature recognition. Feature recognition is useful to recognize characteristic shapes on a given 3D object (typically a solid representing a mechanical part). Characteristic shapes of interest for mechanical design include for example holes, extruded pads, extruded pockets, fillets or rounds, revolute pads, and/or revolute pockets. Recognizing a characteristic shape amounts to identify its specifications through a better semantic level, for example the profile of an extruded or revolute shape, the revolution axis of a revolute shape, the radius value of rounds and fillets, an extrusion direction, and/or an extrusion depth. This information is used either to modify the shape, for example by editing the profile of the extrusion, or to feed a downstream process, machining process for example.

Feature recognition capabilities are available in commercial CAD systems through the following procedure. The user may select the type of feature to recognize. Then, optionally, the user selects one or more faces of the feature on the solid in order to initialize the searching. The system performs the recognition and yields the specifications of the recognized feature.

When the intent is to locally change the shape of the input solid, "direct editing" capability is also available. This technology, also named "history free modeling", is promoted by CAD editors as an alternative to history design. The goal is to easily change the shape of a solid by using only its B-Rep. In order to make the editing simple from the user point of view, the "direct editing" technology has to recognize the local shape of the solid. For example, the system has to maintain the cylindrical shape of a hole (and not change the cylinder into a free form surface), maintain the vertical direction of the pocket's walls, and/or maintain the revolute or extruded nature of a shape. Consequently, feature recognition is unavoidable, even in the "direct editing" field.

Traditional feature recognition deals with one feature at a time. It does not identify multiple copies of a given feature and it does not identify the layout of these copies. As for pattern recognition, the subject is still under development, but existing solutions seem to require many user interventions.

Thus, the existing solutions lack efficiency, notably from a user utilization point of view and from an exhaustiveness point of view. Within this context, there is still a need for an improved solution for designing a 3D modeled object.

SUMMARY OF THE INVENTION

According to one aspect, it is therefore provided a computer-implemented method for designing a 3D modeled object. The method comprises providing geometrical elements that represent the modeled object and that include a set in which the geometrical elements are a copy one of another. The method also comprises defining a graph having nodes, that each represent a geometrical element of the set, and arcs, that each connect a pair of nodes and represent the rigid motion which transforms the geometrical element represented by one node of the pair into the geometrical element represented by the other node of the pair. The method also comprises determining maximal sub-graphs of the graph for which the rigid motions represented by the arcs all respect a predetermined similarity criterion, the similarity criterion being weaker than a predetermined identity criterion. And the method comprises identifying, within the determined sub-graphs, the set of connected components having the highest number of arcs and for which the rigid motions represented by the arcs all respect the identity criterion.

The method may comprise one or more of the following:
the method further comprises iterating the following:
  modifying the graph by collapsing the nodes of each connected component of the identified set of connected components; and repeating the determining and the identifying on the modified graph;
the collapsing comprises: deleting all arcs connected to any node of any connected component of the identified set of connected components; replacing, for each respective connected component, all nodes of the respective connected component by a single node; and adding arcs between pairs of nodes representing connected components that are isometric, each added arc representing the rigid motion which transforms the connected component represented by one node of the pair into the connected component represented by the other node of the pair;
the identifying comprises: selecting, within the determined sub-graphs, the sub-graph having the highest number of arcs, and testing whether the rigid motions represented by the arcs of each of the connected components of the selected sub-graph all respect the identity criterion;
the identifying further comprises, as a result of the testing: if the result of the testing is positive, identifying the set of connected components as the connected components of the selected sub-graph; else, if the result of the testing is negative, splitting the selected sub-graph and re-running the selecting and the testing; and/or
the splitting comprises: cutting, from the selected sub-graph, the arcs of the sub-graph of the selected sub-graph that, among all sub-graphs of the selected sub-graph, has the highest number of arcs and for which the rigid motions represented by the arcs all respect the identity criterion; and creating a new sub-graph with the cut arcs.

It is further proposed a computer program comprising instructions for performing the above method. The computer program is adapted to be recorded on a computer readable storage medium.

It is further proposed a computer readable storage medium having recorded thereon the above computer program.

It is further proposed a CAD system comprising a processor coupled to a memory and a graphical user interface, the memory having recorded thereon the above computer program.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

Embodiments of the invention will now be described, by way of non-limiting example, and in reference to the accompanying drawings, where:

FIGS. 4-30 show examples of the method.

DETAILED DESCRIPTION OF THE INVENTION

A description of example embodiments of the invention follows.

The teachings of all patents, published applications and references cited herein are incorporated by reference in their entirety.

Figure 1:
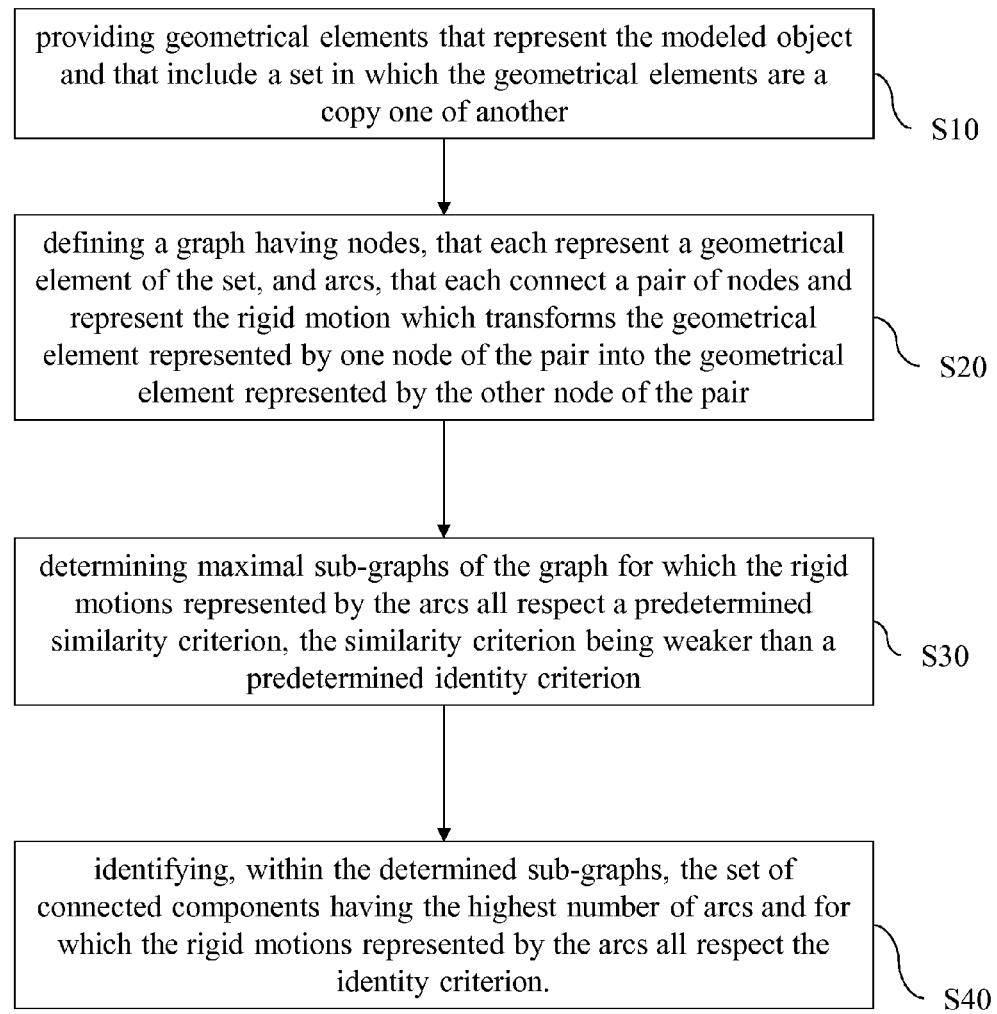
FIG. 1 shows a flowchart of an example of the method.

FIG. 1 shows a flowchart of the computer-implemented method for designing a 3D modeled object. The method comprises providing S10 geometrical elements. The geometrical elements represent the modeled object. The geometrical elements that are provided at S10 include a set in which the geometrical elements are a copy one of another. The method also comprises defining S20 a graph having nodes and arcs that each connect a pair of nodes. The nodes each represent a geometrical element of the set. The arcs each represent the rigid motion which transforms the geometrical element represented by one node of the pair into the geometrical element represented by the other node of the pair. The method also comprises determining S30 maximal sub-graphs of the graph. The maximal sub-graphs determined at S30 are among those for which the rigid motions represented by the arcs all respect a predetermined similarity criterion. The similarity criterion is weaker than a predetermined identity criterion. And the method also comprises identifying S40, within the determined sub-graphs (determined at S30), the set of connected components having the highest number of arcs and for which the rigid motions represented by the arcs all respect the identity criterion.

Such a method constitutes an improved solution for designing a 3D modeled object. By identifying S40 connected components for which the rigid motions represented by the arcs all respect the identity criterion, the method determines geometrical patterns and thereby opens pattern-based designing functionalities to the user. By identifying S40 these patterns within maximal sub-graphs of the graph for which the rigid motions represented by the arcs all respect a predetermined similarity criterion weaker than the identity criterion, the method performs an adequate identification to better grasp intended patterns and facilitate design even more. Notably, by determining sub-graphs that are maximal according to the specific criteria of S30 and by identifying at S40 a set of connected components having the highest number of arcs within these sub-graphs according to the specific criteria of S40, the method optimizes the pattern recognition according to the total number of arcs in recognized patterns, thus recognizing most intended patterns. Because the method mixes the use of the similarity criterion and the identity criterion in its specific way, the method recognizes patterns likely to belong to a "pattern of patterns" structure themselves. Thus, the method constitutes a first step toward recursive pattern recognition, thereby preparing the data for such recursive pattern recognition. Because the method relies on a graph definition S20 and on geometrical computations, the method may be easily implemented and thus automatized, and thereby identify meaningful patterns in an exhaustive and fast way. This is all detailed in the following discussions.

A modeled object is any object defined by data stored in a memory of a computer system. By extension, the expression "modeled object" designates the data itself "Designing a 3D modeled object" designates any action or series of actions which is at least part of a process of elaborating a 3D modeled object. Thus, the method may comprise creating the 3D modeled object from scratch. Alternatively, the method may comprise providing a 3D modeled object previously created, and then modifying the 3D modeled object.

The 3D modeled object may be a CAD modeled object or a part of a CAD modeled object. In any case, the 3D modeled object designed by the method may represent the CAD modeled object or at least part of it, e.g. a 3D space occupied by the CAD modeled object. A CAD modeled object is any object defined by data stored in a memory of a CAD system. According to the type of the system, the modeled objects may be defined by different kinds of data. A CAD system is any system suitable at least for designing a modeled object on the basis of a graphical representation of the modeled object, such as CATIA. Thus, the data defining a CAD modeled object comprise data allowing the representation of the modeled object (e.g. geometric data, for example including relative positions in space).

The method may be included in a manufacturing process, which may comprise, after performing the method, producing a physical product corresponding to the modeled object, e.g. according to the geometrical pattern(s) recognized by the method (in such a case, the manufacturing process may be fed with information on said geometrical pattern(s)). In any case, the modeled object designed by the method may represent a manufacturing object. The modeled object may thus be a modeled solid (i.e. a modeled object that represents a solid). The manufacturing object may be a product, such as a part, or an assembly of parts. Because the method improves the design of the modeled object, the method also improves the manufacturing of a product and thus increases productivity of the manufacturing process. The method can be implemented using a CAM system, such as DELMIA. A CAM system is any system suitable at least for defining, simulating and controlling manufacturing processes and operations.

The method is computer-implemented. This means that the method is executed on at least one computer, or any system alike. For example, the method may be implemented on a CAD system. Thus, steps of the method are performed by the computer, possibly fully automatically, or, semi-automatically (e.g. steps which are triggered by the user and/or steps which involve user-interaction). Notably, the providing S10 and/or the defining S20 may be triggered by the user. The determining S30 and/or the identifying S40 may be performed automatically (i.e. without any user intervention), or semi-automatically (i.e. involving—e.g. light-user-intervention, for example for validating the result or adding/deleting user-determined elements to/from the sub-graphs and/or the set of connected components).

A typical example of computer-implementation of the method is to perform the method with a system suitable for this purpose. The system may comprise a memory having recorded thereon instructions for performing the method. In other words, software is already ready on the memory for immediate use. The system is thus suitable for performing the method without installing any other software. Such a system may also comprise at least one processor coupled with the memory for executing the instructions. In other words, the system comprises instructions coded on a memory coupled to the processor, the instructions providing means for performing the method. Such a system is an efficient tool for designing a 3D modeled object.

Such a system may be a CAD system. The system may also be a CAE and/or CAM system, and the CAD modeled object may also be a CAE modeled object and/or a CAM modeled object. Indeed, CAD, CAE and CAM systems are not exclusive one of the other, as a modeled object may be defined by data corresponding to any combination of these systems.

The system may comprise at least one GUI for launching execution of the instructions, for example by the user. Notably, the GUI may allow the user to trigger the step of providing S10, and then, if the user decides to do so, e.g. by launching a specific function (e.g. entitled "recursive pattern recognition"), to trigger the defining S20. The determining S30 and then the identifying S40 may then be performed automatically or semi-automatically.

The 3D modeled object is 3D (i.e. three-dimensional). This means that the modeled object is defined by data allowing its 3D representation. Notably, the geometrical elements provided at S10 are 3D (i.e. they are defined in 3D, such that the union of all geometrical elements may be not includable in a plane). A 3D representation allows the viewing of the representation from all angles. For example, the modeled object, when 3D represented, may be handled and turned around any of its axes, or around any axis in the screen on which the representation is displayed. This notably excludes 2D icons, which are not 3D modeled, even when they represent something in a 2D perspective. The display of a 3D representation facilitates design (i.e. increases the speed at which designers statistically accomplish their task). This speeds up the manufacturing process in the industry, as the design of the products is part of the manufacturing process. It is noted that the discussion concerning the 3D character of the method holds true, even though some examples on the figures are represented in 2D. It has to be understood that these examples are for the purpose of understanding the method.

Figure 2:
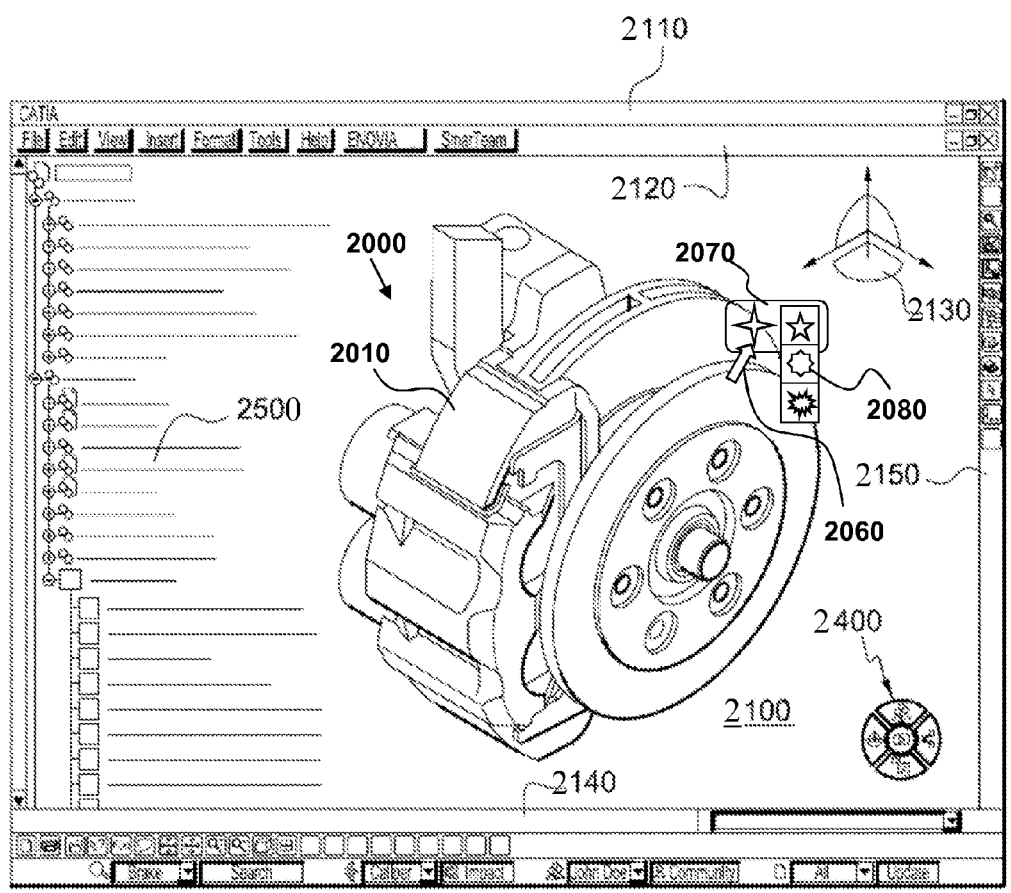
FIG. 2 shows an example of a graphical user interface.

FIG. 2 shows an example of the GUI of a typical CAD system.

The GUI 2100 may be a typical CAD-like interface, having standard menu bars 2110, 2120, as well as bottom and side toolbars 2140, 2150. Such menu and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. a sculpting operation, or any other operation such change the dimension, color, etc.) or edit geometrical constraints by selecting an appropriate icon. For example, typical CAD operations are the modeling of the punching or the folding of the 3D modeled object displayed on the screen.

The GUI may for example display data 2500 related to the displayed product 2000. In the example of FIG. 2, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 3:
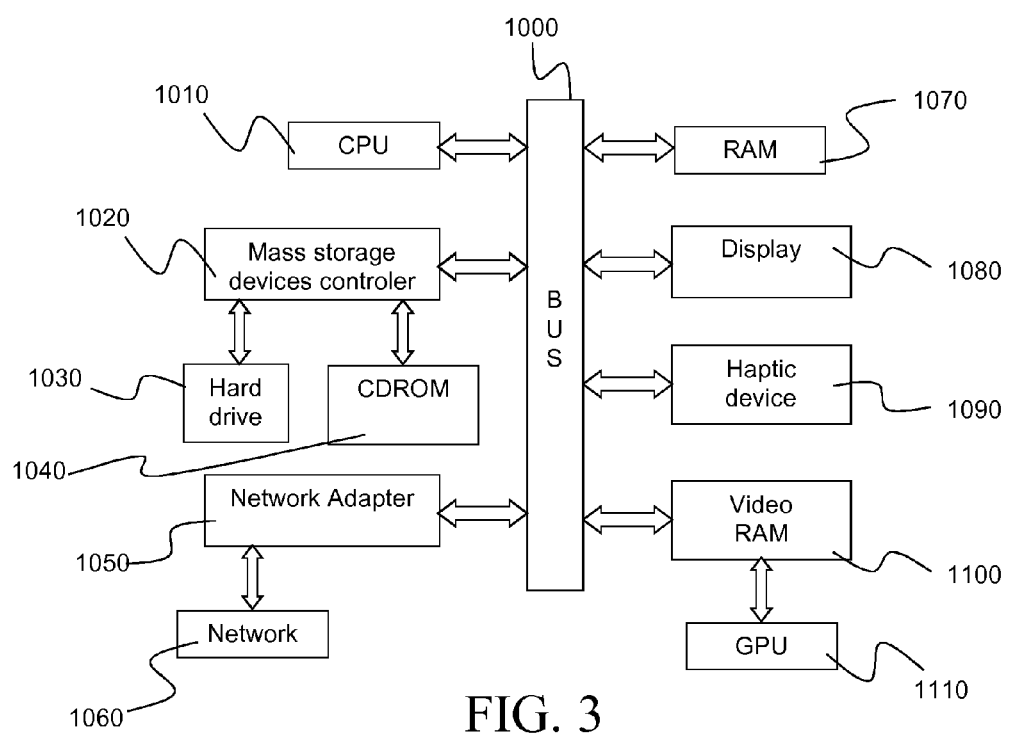
FIG. 3 shows an example of a client computer system.

FIG. 3 shows an example of the architecture of the system as a client computer system, e.g. a workstation of a user.

The client computer comprises a central processing unit (CPU) 1010 connected to an internal communication BUS 1000, a random access memory (RAM) 1070 also connected to the BUS. The client computer is further provided with a graphics processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks, magneto-optical disks, and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on screen 1080, as mentioned with reference to FIG. 2. By screen, it is meant any support on which displaying may be performed, such as a computer monitor. In addition, the cursor control device allows the user to select various commands, and input control signals. The cursor control device includes a number of signal generation devices for input control signals to system. Typically, a cursor control device may be a mouse, the button of the mouse being used to generate the signals.

To cause the system to perform the method, it is provided a computer program comprising instructions for execution by a computer, the instructions comprising means for this purpose. The program may for example be implemented in digital electronic circuitry, or in computer hardware, firmware, software, or in combinations of them. Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output. The instructions may advantageously be implemented in one or more computer programs that are executable on a programmable system including at least one programmable processor coupled to receive data and instructions from, and to transmit data and instructions to, a data storage system, at least one input device, and at least one output device. The application program may be implemented in a high-level procedural or object-oriented programming language, or in assembly or machine language if desired; and in any case, the language may be a compiled or interpreted language. The program may be a full installation program, or an update program. In the latter case, the program updates an existing CAD system to a state wherein the system is suitable for performing the method.

The providing S10 is now discussed.

The method comprises providing S10 geometrical elements that represent the modeled object. The geometrical elements are thus part of the geometry of the modeled object. The geometrical elements may be of any type. For example, the geometrical elements may comprise elementary solids, elementary curves, and/or elementary surfaces. In an example widely used in CAD and mostly discussed in the following, the geometrical elements may be (e.g. all the) faces of a boundary representation (B-Rep) of the modeled object provided at S10. The geometrical elements may also be geometrical patterns of faces of a B-Rep. In such a case, the method directly performs a pattern of patterns recognition.

The providing S10 may result from a designer working on a modeled object (e.g. on its boundary representation), or for example from the fact that the method may be applied to already existing models such as B-Reps, e.g. retrieved in existing libraries. The modeled object may in any case be provided at S10 as a B-Rep. The boundary representation is a widely known format for modeling a 3D object in terms of its envelop (i.e. its outer surfaces). The B-Rep thus designates data of a specific format that may comprise geometrical data and topological data. Geometrical data are data that provide geometrical entities, which are entities described in terms of 3D positions. Topological data are data that provide topological entities, which are entities described in terms of references to geometrical entities and/or relationships with other topological entities, e.g. relative positioning. Typically, the relationships may include an "is bounded by" relationship that associates a topological entity to other topological entities by which they are topologically bounded.

The providing S10 may exclude any history data. In other words, the modeled object provided at S10 may be history-free. This means that the modeled object is not associated to any data indicating the history of its design, but only by declarative data, including e.g. the B-Rep. Thus, the method may work within a context where the designer is not in possession of the history of the modeled object, which notably implies that geometrical patterns designed on the modeled object are not defined as such in the data provided at S10.

In the case of the method, the (e.g. geometrical) data may include so-called "supporting surfaces", for example parametric surfaces (i.e. 3D surfaces modeled in terms of 3D positions associated to parameters defining a 2D domain). The supporting surfaces may typically be Nurbs surfaces, but also planar, canonical or procedural surfaces. And the (e.g. topological) data may include at least a set of faces, each face being defined as a bounded portion of a respective supporting surface (provided in the geometrical data). Thus, a face corresponds to a trimmed surface. The supporting surfaces are thus surfaces on which the faces are defined (thereby "supporting" the faces), in any way, by a trimming operation. The geometrical elements provided at S10 may thus be such faces, defined in the whole data.

The notion of B-Rep, although widely known, is now further discussed through an example of a modeled object that may be provided at S10. Other examples of B-Reps, for example with relationships different from the "is bounded by" relationship, for at least some topological entities, may however be contemplated by the method. Also, non B-Rep representations may be contemplated by the method.

As already mentioned, a B-Rep of a modeled object may include topological entities and geometrical entities. The geometrical entities may comprise 3D objects that are surfaces (e.g. planes), curves (e.g. lines) and/or points. Surfaces may be provided as functions of two parameters. Curves may simply be provided as functions of one parameter. And points may be provided as 3D positions. The topological entities may comprise faces, edges, and/or vertices. By its definition, a face corresponds to a bounded portion of a respective surface, named "supporting surface". The term "face" may thus indifferently designate such bounded portion of the surface or the corresponding bounded portion of the 2D domain. Similarly, an edge corresponds to a bounded portion of a curve, named e.g. the supporting curve. The term "edge" may thus designate such bounded portion of the curve or of its domain. A vertex may be defined as a link to a point in 3D space. These entities are related to each other as follows. The bounded portion of a curve is defined by two points (the vertices) lying on the curve. The bounded portion of a surface is defined by its boundary, this boundary being a set of edges lying on the surface. Edges of the face's boundary are connected together by sharing vertices. Faces are connected together by sharing edges. By definition, two faces are adjacent if they share an edge. Similarly, two edges are adjacent if they share a vertex. Surfaces, curves, and points may be linked together via their parameterization. For example, a value of the parameter of the parametric function defining a curve may be provided to define a bounding vertex. Similarly, a function linking the parameter of a curve to the two parameters of a surface may be provided to define a bounding edge. However, the very detailed structure of such topological data of a B-Rep is out of the scope of the present explanations.

FIGS. 4 and 5 illustrate the B-rep model of a cylindrical slot 80; that may be what is provided at S10 and that is made of three faces numbered 1, 2 and 3 on the figures: top planar face 1 and two lateral cylindrical faces 2 and 3. FIG. 4 shows a perspective view of slot 80. FIG. 5 shows the exploded view of all faces. Duplicated numbers illustrate edges and vertices sharing. Face 1 is a bounded portion of a plane. Boundary of face 1 includes edges 4 and 5, each of them being bounded by vertices 10 and 11. They both have the same supporting circle. Face 2 is bounded by edges 6, 8, 5 and 13 all lying on an infinite cylindrical surface (i.e. the supporting surface of face 2). Faces 1 and 2 are adjacent because they share edge 5. Faces 2 and 3 are adjacent because they share edges 8 and 13. Faces 1 and 3 are adjacent because they share edge 4.

FIG. 6 illustrates the "is bounded by" topological relationship of the B-rep model of slot 80. Nodes of higher layer 101 are faces, nodes of intermediate layer 103 are edges and nodes of lower layer 105 are vertices. FIGS. 7 and 8 illustrate the relationship between topological entities (faces, edges, vertices) and the supporting geometries (infinite cylinder, infinite plane, infinite line, points). In the CAD system, the B-rep model gathers in an appropriate data structure the "is bounded by" relationship and the relationship between topological entities and supporting geometries, and mathematical descriptions of supporting geometries. In other words, the data structures shown on FIGS. 6 and 7 are part of the topological data of this example, which comprise links to geometrical entities of the geometrical data (this is FIG. 7) and links between topological entities (this is FIG. 6).

Other actions (including steps S20-S40) of the method are now discussed.

The geometrical elements provided at S10 comprise a set (e.g. at least one set) in which the geometrical elements are a copy one of another, or, in other words, geometrically identical one to each other, or geometric replicas one of the other. The method comprises defining S20 a graph based on these geometrical elements. For this, the method may comprise providing a predetermination of the set(s), or, alternatively determining the set(s) (e.g. the method determines specific data linking the elements of the set together). This allows performing the defining S20 faster. For example, in the case the geometrical elements are a set of faces of a B-Rep, the method may comprise, e.g. upon user triggering, the determining of all subsets of faces of the boundary representation for which the faces are a copy one of another. The set of S10 may be determined according to any implementation desired by the skilled person. For example, the method may comprise performing comparisons between pairs of faces, the faces being browsed according to any order. Such comparisons may be performed in any way. Examples are provided later. Also, as known from the field of CAD, any determination involving numerical computations is subject to the necessary numerical approximations applied by the system. In the present case, faces may be determined to be a copy of each other although they are in theory slightly different. Thus, the method may actually determine a set of faces that are substantially a copy one of another. However, the way the approximations are implemented is not the subject of the present discussion, such that "substantially a copy one of another" and "a copy one of another" are not distinguished in the following. It is indeed only considered that the method follows a predetermined criterion for telling if two geometrical elements, e.g. faces, are a copy one of another. It also has to be understood that the method may alternatively define S20 the graph directly, without a prior determination of the set(s) of geometrical elements that are a copy one of another.

The method comprises defining S20 a specific graph later extensively used by the method. As known from graph theory, a graph is a mathematical object having nodes and arcs that each connect a pair of nodes. The method thus defines S20 such a structure in terms of computer data, starting from the data provided at S10, possibly after identifying the set of geometrical elements that are a copy one of another (that may be determined by the method or provided as such). It is noted here that if several of such sets are determined, as many graphs may be respectively defined at S20. Or the method may be later iterated on the sets not handled in the first iteration. These are implementation details. It is also noted that the graph may be defined on the whole set of copies or on a part of it. This is also a matter of implementation. In a first approach, in order to perform the pattern recognition exhaustively, the defining S10 may be performed on the whole set.

Now, the graph defined at S20 has a specific structure that formats the data created by the method at S20 (as known from the skilled person). Each node represents a geometrical element (e.g. a face) of the set of copies. For example, each node name is linked, e.g. via a pointer, to a reference of a geometrical element. Similarly, each arc represents the rigid motion which transforms the geometrical element represented by one node of the pair into the geometrical element represented by the other node of the pair. Any geometrical element, including a face, may be seen as a point-set (and thereby handled as such by the method), i.e. a subset of the three-dimensional space $\mathbb{R}^3$. A rigid motion is a mapping D: $\mathbb{R}^3 \to \mathbb{R}^3$ defined between two point-sets by $D(x)=Rx+T$ where R is a rotation and T is a translation vector (possibly null for one of them). Rigid motion D can be noted $D=(R,T)$ for short. A rigid motion is invertible since $y=D(x)$ is equivalent to $x=D^{-1}(y)$ where $D^{-1}(y)=R^{-1}y-R^{-1}T$. The group of three-dimensional rigid motions is traditionally noted SE (3). As the geometrical elements of the set provided at S10 are a copy one of another, given two geometrical elements of the set, one may theoretically be derived from the other one by applying a rigid motion.

The graph gathers data describing such derivations (or transformations). The rigid motions and related geometries may indeed be stored in a directed and connected graph $B=(X, U, \alpha, \omega)$ where nodes X are geometries and arcs U are labeled with rigid motions. The labeling is a mapping m: $U \rightarrow SE (3)$. More precisely, writing that arc $u \in U$ starts at node $\alpha(u)=x \in X$ and ends at node $\omega(u)=y \in X$ means that geometries x and y are copies of each other and that the rigid motion m(u) changes x into y, which is noted: $y=m(u)x$. Now, suppose that arc $v \in U$ connects x et $z \in X$, which is written $\alpha(v)=x$ and $\omega(v)=z$. The rigid motion that changes x into z is $z=m(v) x$. Then, z is also a copy of y and the rigid motion that changes y into z is $z=m(v)m(u)^{-1} y$. Conversely, the rigid motion that changes z into y is $y=m(u)m(v)^{-1}z$.

It is here noted that issues related to the orientation of the arcs may be handled by the skilled person in any way, as they are simple implementation issues. For example, given an arc and given the two nodes connected by the arc, the issue of the starting node to determine the rigid motion may be handled in any way (knowing that if the other node is used as a starting point, the rigid motion will be the inverse). An example of implementation is provided later for the sake of comprehensiveness.

It is also noted that, since the geometrical elements of the set provided at S10 are copies one of another, the graph defined at S20 on this set may be complete, with arcs all defined as the above. However, for the sake of efficiency, the method may define at S20 a graph that is not complete, excluding some of the arcs of the complete graph according to any pre-determined criteria (for example, arcs representing rigid motions having no similarity with any other rigid motion).

The method then comprises determining S30 maximal sub-graphs of the graph that respect some constraints. In other words, the method, under some predetermined constraints, computes maximal sub-graphs of the graph (i.e. a sub-graph being a sub-set of the set of all the nodes and arcs of the graph), that is, sub-graphs having the highest number of elements. The predetermined constraint is the following: a sub-graph determined at S30 must be one for which the rigid motions represented by the arcs all respect a predetermined so-called "similarity" criterion. It is noted here that the sub-graphs determined at S30 are not necessarily disjoint, as will be exemplified later, since some nodes may belong to several different maximal sub-graphs at the same time.

The similarity criterion is a criterion that indicates that two rigid motions are similar in the way they operate on a geometrical object. The similarity criterion is weaker than the identity criterion, which is to indicate that two rigid motions are identical (modulo the above-mentioned approximations inherent to numerical computations). Both the similarity criterion and the identity criterion are predetermined, meaning that the system stores a way to see if pairs of rigid motions respect any or both of these criteria. The method may thus perform comparisons, as known in the field of computer science, based on the predetermined similarity criterion, in any way/order so as to determine the maximal sub-graphs.

Examples and properties of the similarity criterion particularly well-adapted to the field of mechanical design are now provided.

The goal of similarity is to identify that two rigid motions, as well as their inverse, respectively operate the same way on two geometrical objects despite said rigid motions are not necessarily equal and despite said rigid objects are arbitrarily located in 3D space.

For clarity, two steps are followed below to discuss similarity. The first step is to define the so-called "analogy" of two arcs and provides algebraic properties. Since this first definition involves the orientation of arcs, a second step defines "similarity" by reusing "analogy" in such a way that arcs orientations are not relevant.

Let $u_i$, i=1, 2 be two arcs of graph B, and $D_i=m(u_i)$ the rigid motion respectively associated with arc $u_i$. Let $x_i=\alpha(u_i)$ be the geometrical object at the origin of arc $u_i$ and $y_i=\omega(u_i)$ the geometrical object at the end of arc $u_i$. So, by definition $y_i=D_i(x_i)$ for i=1, 2.

By definition, arc $u_1$ is analogous to arc $u_2$, which is noted $u_1 \sim u_2$, if there exists a rigid motion M such that the two following conditions are verified:
1. $D_1=M^{-1} \circ D_2 \circ M$
2. $x_2=M(x_1)$.

Using a more compact notation, this can be written: $m(u_1)=M^{-1} \circ m(u_2) \circ M$ and $\alpha(u_2)=M(\alpha(u_1))$.

In fact, the definition does not depend on choosing origins $x_i$ of arcs $u_i$ rather than ends $y_i$. More precisely, if there exists a rigid motion M like in the previous definition, then there exists another rigid motion S such that $D_1=S^{-1} \circ D_2 \circ S$ and $y_2=S(y_1)$. The proof is as follows.

Firstly:

$$y_2 = D_2(x_2)$$
$$= D_2 \circ M(x_1)$$
$$= D_2 \circ M \circ D_1^{-1} \circ D_1(x_1)$$
$$= D_2 \circ M \circ D_1^{-1}(y_1)$$

Then, it is enough to check that $D_1=S^{-1} \circ D_2 \circ S$ with $S=D_2 \circ M \circ D_1^{-1}$.

$$D_1 = M^{-1} \circ D_2 \circ M$$
$$= D_1 \circ M^{-1} \circ D_2 \circ M \circ D_1^{-1}$$
$$= D_1 \circ M^{-1} \circ D_2^{-1} \circ D_2 \circ D_2 \circ M \circ D_1^{-1}$$
$$= (D_2 \circ M \circ D_1^{-1})^{-1} \circ D_2 \circ (D_2 \circ M \circ D_1^{-1})$$
$$= S^{-1} \circ D_2 \circ S$$

Another important property, named the "inversion property" in the following, is that if two arcs are analogous, then the inverted arcs are analogous as well. Formally, if $u_1 \sim u_2$ then $u_1^{-1} \sim u_2^{-1}$ where notation $u_i^{-1}$ is the inverted arc, starting at $y_i$, ending at $x_i$ and associated with the inverse rigid motion $D_i^{-1}$. The proof is as follows. If $u_1 \sim u_2$ then, on one hand, $D_1=M^{-1} \circ D_2 \circ M$ and so $D_1^{-1}=(M^{-1} \circ D_2 \circ M)^{-1}=M^{-1} \circ D_2^{-1} \circ M$. The other point of the definition $x_2=M(x_1)$ is expressed at end nodes of arcs $u_i^{-1}$, which is valid according to previous remark. This proves that $u_1^{-1} \sim u_2^{-1}$.

"Analogy" is an equivalence relation on the set of arcs. To prove this, the following properties are established.

The first property is reflexivity: any arc is analogous to itself, $u \sim u$, which is obvious by choosing M as the identical rigid motion.

The second property is symmetry: if $u_1 \sim u_2$ then $u_2 \sim u_1$. This is because if $D_1=M^{-1}D_2M$ then $D_2=MD_1M^{-1}$ and if $x_2=M(x_1)$ then $x_1=M^{-1}(x_2)$. This allows saying that "two arcs are analogous" instead of saying that "one of them is analogous to the other one".

The third and last property is transitivity: if $u_1 \sim u_2$ and if $u_2 \sim u_3$ then $u_1 \sim u_3$. Indeed, if $u_2 \sim u_3$, there exists a rigid motion N such that $D_2 = N^{-1}D_3N$ and $x_3=N(x_2)$. But, since $D_1=M^{-1}D_2M$ and $x_2=M(x_1)$, we have respectively $$D_1 = M^{-1}D_2M$$
$$= M^{-1}N^{-1}D_3NM$$
$$= (NM)^{-1}D_3(NM)$$

And $$x_3 = N(x_2)$$
$$= NM(x_1)$$

Which proves that $u_1 \sim u_3$, the rigid motion being NM.

So, the analogy relationship is an equivalence relation on the set of arcs. The drawback is that it depends on arc orientation since when $u_1 \sim u_2$ the relationship $u_1^{-1} \sim u_2$ is not true. This is because $D_1=M^{-1}D_2M$ does not generally imply $D_1^{-1}=M^{-1}D_2M$ unless $D_2=D_2^{-1}$.

So, the definition of similarity may be set up as follows. By definition, arc $u_1$ is similar to arc $u_2$, which is noted $u_1 \approx u_2$, if arc $u_1$ is analogous to arc $u_2$ or if arc $u_1^{-1}$ is analogous to arc $u_2$. In short: $u_1 \approx u_2$ if $u_1 \sim u_2$ or $u_1^{-1} \sim u_2$.

Relation $\approx$ is again an equivalence relation, as proven in the following.

Reflexivity, meaning that $u \approx u$ for all u, is established because $u \sim u$ for all u as well. It should be noticed that $u^{-1}$ is not generally analogous to u.

Symmetry, meaning that if $u_1 \approx u_2$ then $u_2 \approx u_1$, is established as follows. If $u_1 \sim u_2$, then $u_2 \sim u_1$ because $\sim$ is symmetrical, and then $u_2 \approx u_1$. If $u_1^{-1} \sim u_2$ then $u_2^{-1} \sim u_1$ by inversion property, which means that $u_2 \approx u_1$.

Transitivity, meaning that if $u_1 \approx u_2$ and if $u_2 \approx u_3$ then $u_1 \approx u_3$, is established as follows. The statement "$u_1 \approx u_2$ and $u_2 \approx u_3$" gathers four possibilities and it must be checked that each one implies $u_1 \approx u_3$.

1. $u_1 \sim u_2$ and $u_2 \sim u_3$
2. $u_1 \sim u_2$ and $u_2^{-1} \sim u_3$
3. $u_1^{-1} \sim u_2$ and $u_2 \sim u_3$
4. $u_1^{-1} \sim u_2$ and $u_2^{-1} \sim u_3$ Case 1 leads to $u_1 \sim u_3$ because relation $\sim$ is transitive, and then $u_1 \approx u_3$.

Case 2 is equivalent to $u_1 \sim u_2$ and $u_2 \sim u_3^{-1}$ by inversion property. Since $\sim$ is transitive, $u_1 \sim u_3^{-1}$ which is equivalent to $u_1^{-1} \sim u_3$ by inversion property again, meaning that $u_1 \approx u_3$.

Case 3 leads to $u_1^{-1} \sim u_3$ because $\sim$ is transitive, meaning that $u_1 \approx u_3$.

Case 4 is equivalent to $u_1^{-1} \sim u_2$ and $u_2 \sim u_3^{-1}$. Since $\sim$ is transitive, $u_1^{-1} \sim u_3^{-1}$ meaning that $u_1 \sim u_3$ by inversion property, and then $u_1 \approx u_3$.

According to basic algebra, the similarity relation separates the set of arcs into maximal and disjoint subsets, which may be named "equivalence classes" in the following. If extended with the nodes connected by the arcs, these equivalence classes may constitute the sub-graphs determined at S30.

Once the maximal sub-graphs are determined at S30 as discussed above, the method comprises identifying S40 at least one geometrical pattern within the determined sub-graphs, each connected component of the set identified at S40 being actually declaratively seen as a geometrical pattern by the method. The fact that the set of connected components is identified at S40 within the sub-graphs determined at S30 means that a specific sub-sub-graph of one of the maximal sub-graphs (i.e. the set of connected components), possibly a whole maximal sub-graph, (possibly the null graph in extreme cases or in the end of iterations if the method is iterated, as discussed later, but generally not the null graph) is identified according to some conditions.

By "identifying" a set of connected components, it is meant that data is added to the modeled object in order to indicate the existence of said connected components and the connections between geometrical elements that form so-called connected components. For example, group names are created and links between geometrical elements or groups of geometrical elements and the group name are added to the (data defining the) modeled object. This way of linking elements together may also be implemented for the determining S30. The new data may be possibly stored on persistent memory or at least long enough for the user to work on the geometrical pattern. These are just matters of implementation known to the skilled person.

Moreover, the method identifies geometrical patterns. The expression "geometrical pattern" means that the elements belonging to a geometrical pattern constitute geometry of whose elements (e.g. faces or groups of faces) are positioned in a predictable manner, i.e. according to predetermined rules, thereby excluding complete randomness. A so-called "connected component" is simply a connected graph. In the case of the method, the contemplated connected components are connected sub-sub-graphs of the maximal sub-graphs determined at S30 that respect some criteria. Namely, the arcs of the connected components must represent rigid motions that respect the identity criterion (i.e. all the rigid motions of one connected component are identical, according to the predetermined identity criterion defined for the method). Thus, the geometrical elements represented by the nodes of a connected component are all obtainable by applying one same rigid motion to one initial geometrical component, represented by one of the nodes (the geometrical pattern may actually have been designed as such prior to the method e.g. by another user). This enters the definition of a geometrical pattern.

Furthermore, the set of connected components is a set of geometrical patterns with similar rigid motions: the identical rigid motions of one connected component of the set identified at S40 are similar to the identical rigid motions of another connected component of the set identified at S40. Thus, by outputting such "set of connected components" structure, the method launches a "pattern of patterns" recognition. Indeed, thanks to the nature of the similarity criterion that is used, when several connected components are identified in the set at S40 (depending on the input data, the set identified at S40 may comprise only one connected component, but in some situations it comprises more than one), the connected components may possibly be obtainable one from the other with a rigid motion. A pattern of patterns may thus be recognized, as exemplified later.

Because the geometrical elements of the geometrical pattern are first selected to be copies one of another, the method recognizes geometrical patterns that have a meaning according to design intent. Also, the set of connected components is selected, within the sub-graphs determined at S30, among all possible sets of connected components for which the rigid motions represented by the arcs all respect the identity criterion, as the one having the highest number of arcs (in total, counting all the arcs of the set of connected components, i.e. adding together for all the connected components of the set the total number of arcs of each connected component). This can be implemented in any way, but an example possibly involving a so-called "splitting" is provided later. Cases where several such sets exist may be handled in any way desired by the skilled person. Such a selection of the set of connected components identified at S40 allows a good grasp of user intent. In other words, the pattern structure recognized by the method is statistically the most meaningful to the user. Notably, this proves to hold particularly true in the field of mechanical design, to which the method can be applied as already discussed.

Thus, the identification S40 allows easier designing. First of all, this allows the later presentation to the user of the geometrical pattern structure (i.e. the set of connected components structure). The user may thus grasp intent of the designer. This also allows later design actions performed globally on the geometrical pattern structure (i.e. in an automatically unified way), as mentioned earlier. For example, the user may translate a whole connected component or the whole set of connected components with a single "drag and drop" action. Or, the user may increase the size of all elements of any or all of the connected component of the set by selecting it and then entering the new size for its elements only once. These are only examples. The method may comprise any or several of such later design actions that involve the result of the identifying S40. This is useful in the field of CAD in general, since the method allows achieving some specific designs involving geometrical patterns with less user actions. This is particularly useful in the field of mechanical design, when the modeled object represents a product, the method belonging in such a case to a global industrial process necessitating time optimization of all its phases. The method may also comprise feeding a manufacturing process with the recognized set of connected components.

Thus, by performing simple geometrical comparisons e.g. based on face definitions, and by performing limited graph-based computations, the method efficiently identifies geometrical pattern structures in the form of a set of connected components that may be complex (more elaborate than a single pattern corresponding to a single connected component), without the need that the user identifies (i.e. preselects) any specific geometrical element or position on the modeled object for helping the identification. The method may actually exclude such identification made by the user. Thus, the method may allow an efficient identification of patterns e.g. adapted to the boundary representation of a modeled object. The method does not require any user's visual analysis of the geometry. The method concentrates on arrangements of duplicated geometries by systematically analyzing the input geometry. Since the user is not directly involved in the process, time is saved for other tasks. Furthermore, as explained later the method may be used to yield the whole pattern of patterns structure of the modeled object. This is a one shot process. Consequently, the invention shortens the time spent for pattern recognition and provides the best possible result.

It is noted that the method may be somehow iterated. In essence, at each iteration, the connected components identified at S40 of the previous iteration are considered as geometrical elements as such. This way, the method may recursively determine the whole pattern of patterns structure of the provided model, the connected components determined at the first iteration of S40 being possibly part of higher-level connected components that are determined at next iterations of S40.

More precisely, the method may further comprise iterating the following actions. First, after the identifying S40 of the previous iteration of the method, the method may modify the graph (defined at S20 of the first iteration when at the second iteration, or already modified at a previous iteration when at a later iteration) by collapsing the nodes of each connected component of the identified set of connected components. This amounts to reducing the graph by merging the nodes of each connected component of the set together, in a "connected component by connected component" way. Then the method performs the determining S30 and the identifying S40 on the modified graph. In other words, the graph defined at S20 is kept and, as it is modified throughout iterations of the method, its modified version is used as an input for the determining S30 and the identifying S40 of each subsequent iteration. This way, the method exhaustively and recursively recognizes all patterns in the set of geometrical elements that is provided at S10. As the connected components are handled as such by each iteration of the method, the method may recognize patterns of patterns at any recursive order. Furthermore, the way the method is performed allows to do so with relatively low computational complexity.

Now, the collapsing may be performed simply by comprising the following actions. The collapsing may comprise deleting all arcs connected to any node of any connected components of the identified set of connected components. In other words, the connected components are reduced to their nodes, and none of the arcs present in the graph (before the identifying S40) that were connected to one of said nodes are kept. Then, the collapsing may replace, for each respective connected component, all nodes of the respective connected component by a single node. This is a simple reference management problem from a data handling point of view. Finally, the collapsing may comprise adding arcs between pairs of nodes thus added. Notably, the added arcs are added between nodes that represent (i.e. they derive in the previous step from) connected components that are isometric. Said connected components are thus geometrically identical modulo a rigid motion. Each added arc actually represents the rigid motion which transforms the connected component represented by one node of the pair into the connected component represented by the other node of the pair. Again, the handling of the orientation is a matter of implementation. Thus, the global structure of the graph defined at S20 is kept. This allows performing the determining S30 and the identifying S40 with the same algorithm blocks, and thus in an efficient way.

Examples of the method are now discussed, after providing some definitions. In the examples, the providing S10 comprises providing a B-Rep of the modeled object. The geometrical elements are at first the faces defined in the B-Rep. Notably, the application may be mechanical design, the modeled object representing a product such as a part or an assembly of parts, where pattern recognition is particularly useful.

Given a point-set X, a point-set Y is a "replica" of X if there exists a rigid motion D such that $Y=\{D(x), x \in X\}$, which is noted $Y=D(X)$ in short.

An "oriented point-set" is a couple $(X, u_X)$ where $X \subset \mathbb{R}^3$ is a point-set and $u_X$ is a mapping $u_X: X \to S^2$ where $S^2$ is the set of unit vectors of $\mathbb{R}^3$. In other words, at any point $x \in X$, a unit vector $u_X(x)$ is defined.

An oriented point-set $(Y, u_Y)$ is a "copy" of an oriented point-set $(X, u_X)$ if Y is a replica of X that saves the orientation. More precisely, for all $x \in X$, the unit vector of the corresponding point $D(x)$ on the replica is the rotated unit vector of X at point x. Formally, for all x∈X, $u_Y(D(x))=Ru_X(x)$, meaning that the following diagram is commutative.

$$\begin{array}{ccc} X & \overset{u_X}{\to} & S^2 \\ \downarrow D & & \downarrow R \\ Y & \overset{u_Y}{\to} & S^2 \end{array}$$

The relation "is a copy" on point-sets, on which the defining S20 may rely, is an equivalence relation. To prove that, it is enough to check the following properties, which is not difficult: (1) a point-set is a copy of itself, (2) if Y is a copy of X then X is a copy of Y and (3) if Y is a copy of X and Z is a copy of Y, then Z is a copy of X.

According to basic algebra, given a finite set G of point-sets (meaning that elements of G are point-sets) the equivalence relation "is a copy" separates G into disjoint and maximal subsets $G_i$ of copies. This means that $G_i \cap G_j = \emptyset$ if i≠j, that $G = \cup_i G_i$, that if X, Y∈$G_i$ then Y is a copy of X and that if X∈$G_i$ and Y∉$G_i$ then Y is not a copy of X. The subsets $G_i$ are in fact "classes" of point-sets by reference to the equivalence classes of an equivalence relation.

The previous theory applies (but is not restricted) to the faces of a solid (i.e. the modeled object in the example is a solid). Faces play the role of point-sets and the solid's B-Rep is the set G. In other words, to determine the sets of faces that are copy one of another for the defining S20, the skilled person may represent the faces as point-sets and the B-Rep provided at S10 as a set G as defined above.

An example of determining sets of faces of the B-Rep that are copies one of another is now discussed.

Given a modeled object e.g. that represents a solid, the B-Rep of said solid provided at S10 is considered as a set of independent faces. Meaning that $G = \{f_1, \ldots, f_n\}$ where $f_i$ is the i-th face of the solid. The very first step is to compute subsets of G according to the "is a copy" relation. The overall algorithm may be as follows.

```
For i := 1 to n do begin
    If f_i is not already used in a subset then
        Create a new subset G_i := {f_i}
        For j := i + 1 to n do begin
            If f_j is not already used in a subset then
                If f_j is a copy of f_i then
                    G_i := G_i ∪ {f_j}
                    Store the rigid motion that changes
                    f_i into f_j
                End if
            End if
        End for
    End if
End for
```

An example of how to implement the "is a copy" relation for faces is now discussed.

As explained earlier, a face of a solid is defined by a supporting surface (e.g. a plane) and by boundary edges. In an example, the face is equipped with the outer normal vector of the solid. The boundary edges are oriented according to this normal vector. Boundary edges are connected by sharing vertices.

In order to perform comparisons and to find the rigid motions, each face is equipped with several axis systems. At each vertex v of the face, an axis system is created as follows. The coordinates of the origin point P are the coordinates of the vertex v. First vector, noted U, is tangent to the input boundary edge of v and such that –U is oriented like the boundary edge. Second vector, noted V, is tangent to the output boundary edge of v and is oriented in the boundary edge direction. Words "input" and "output" are related to the topological orientation of the boundary edges according to the normal vector of the face. The third vector is the outer normal vector N of the face computed at vertex v. Despite N is always perpendicular to U and to V, it should be noticed that the axis system (P, U, V, N) is not generally direct and orthogonal.

FIGS. 9-11 illustrate the axis systems of a semi-cylindrical face 90. FIG. 9 shows face 90 and its normal vector 92. FIG. 10 shows the topological orientation of boundary edges 94 induced by normal vector 92. Boundary edge a is an input edge of vertex v. Boundary edge b is an output edge of vertex v. FIG. 11 displays vectors U, V, N of axis systems at each boundary vertex.

Now, the method may, in an example, within the determining of the sets of copy faces, determine if two faces are copies one of another by directly searching the rigid motion between them (which can then be used in the defining S20), if any. Let f, g be two faces respectively equipped with (the same number of) local axis systems $S_1^f, \ldots, S_m^f$ and $S_1^g, \ldots, S_m^g$. If faces f, g do not have the same number of local axis systems, it means that they do not have the same number of boundary vertices, so they are determined not to be copies of each other and the rigid motion search is not launched.

Otherwise, the first step is to compute the rigid motions $D_{i,j}$ respectively changing the i-th axis system of face f into the j-th axis system of face g. Since i, j=1, . . . , m, there exists at most $m^2$ such rigid motions. Formally, rigid motions are such that $D_{i,j}(S_i^f) = S_j^g$. Noting $S_i^f = (P_i^f, U_i^f, V_i^f, N_i^f)$, $S_j^g = (P_j^g, U_j^g, V_j^g, N_j^g)$ and $D_{i,j}(x) = R_{i,j}x + T_{i,j}$ this is achieved by first solving the following linear system, keeping in mind that the unknowns are the coefficients of matrix $R_{i,j}$ and coordinates of vector $T_{i,j}$.

$$R_{i,j}U_i^f = U_j^g$$

$$R_{i,j}V_i^f = V_j^g$$

$$R_{i,j}N_i^f = N_j^g$$

$$T_{i,j} - R_{i,j}P_i^f = P_j^g$$

Secondly, to insure that matrix $R_{i,j}$ is a rotation, the two following conditions must be checked.

$$R_{i,j}R_{i,j}^T = I$$

$$det(R_{i,j}) = 1$$

Otherwise, $D_{i,j}$ is not a rigid motion because $R_{i,j}$ is not a rotation.

Then, the rigid motion D* that changes f into g, if any, is to be found among the previously computed $D_{i,j}$. The problem is now to answer the question: given f, g and a rigid motion D, is D(f)=g true? This may be done by sampling face f with a collection of 3D points $x_k$, k=1, . . . , q and by checking that the distances between points $D(x_k)$ and face g are small enough compared to a predetermined numerical threshold for identical objects. If, among the $D_{i,j}$, several rigid motions can change f into g, then a pure translation is selected when possible. This is an efficient way of performing the determining of sets of copy faces, leading to results compliant with user intent.

An example of the data structure for the determined sets of copy faces (i.e. the above-mentioned "subsets") is now discussed.

The rigid motions and related point-sets may be stored in an appropriate data structure, now discussed, in order to retrieve copies of a given point-set (corresponding to a given face) and the associated rigid motions. Conceptually, this data structure includes a directed graph W=(P, A, α, ω) where nodes P are point-sets and arcs A are labeled with rigid motions. The labeling is a mapping m: A→SE (3) where SE (3) is the group of three-dimensional rigid motions. More precisely, writing that arc u∈A starts at node α(u)=x∈P and ends at node ω(u)=y∈P means that point-sets x and y are copies of each other and that the rigid motion m (u) changes x into y, which is noted: y=m(u)x. Now, suppose that arc v∈A connects x et z∈P, which is written α(v)=x and ω(v)=z. The rigid motion that changes x into z is z=m(v) x. Then, z is also a copy of y and the rigid motion that changes y into z is z=m(v) m(u)$^{-1}$y. Conversely, the rigid motion that changes z into y is y=m(u)m(v)$^{-1}$z. This information may be all captured by the data structure.

By nature, the algorithm computing initial subsets creates a graph made of depth-1 tree graphs, each of them being a subset. By definition, a depth-1 tree is a tree graph featuring one node with no input arc (the root node) and all other nodes with no output arc nodes (leaf nodes). In other words, all non-root nodes are connected to the root node. Consequently, given any two nodes within a depth-1 tree graph, there exists only one path of arcs joining them, and this unique path includes only two arcs.

FIGS. 12-13 illustrate the graph data structure resulting from the algorithm computing initial subsets (the determining of sets of copy faces). FIG. 12 illustrates a B-Rep 120 of a modeled object consisting of four aligned cylindrical slots, with faces numbered from 1 to 12. They are numbered according to some arbitrary storage in the topological data structure. FIG. 13 illustrates the graph 130, including two depth-1 trees 132.

Accordingly, the rigid motion that changes one point-set into any other point-set is computed by combining rigid motions along the path of arcs joining the two said point-sets. Since this path includes two arcs, only two rigid motions are combined. This facility of computing the rigid motion relating to any two point-sets within a subset is widely used in this example of the method. From such a graph, the method may thus perform the defining S20 very easily, because the rigid motion between any pair of copy faces may be retrieved/determined simply from a graph like graph 130.

At this point, the method may thus have collected all duplicated geometries and the related rigid motions into a graph that may be noted A. Nodes of graph A represent geometries, arcs of graph A represent rigid motions. Each connected component B of graph A (a graph defined at S20) gathers copies of the same geometry and is potentially a complex structure.

An example of next steps of the method is the following.
1. Within each connected component B of graph A, arcs are grouped into separate subsets according to similarity criteria classes. This is an example of the determining S30.
2. Then, the subset that includes the largest number of arcs is the best candidate to capture the most duplicated elementary structure. This is an example of the start of the identifying S40.
3. The sub graph C of B corresponding to this largest subset of arcs is considered, and connected components $C_i$ of C are computed. This is an example of the next phase of the identifying S40.
4. If all arcs of each connected component $C_i$ represent the same rigid motion, then an elementary pattern is recognized. This is an example of the end of the identifying S40.
5. Graph B is simplified into a new graph B' by merging nodes of each connected component $C_i$ into a single node and by discarding useless arcs. This is an example of modifying the graph by collapsing the nodes of each connected component of the identified set of connected components.

The goal of steps 1 and 2 is to provide adequate conditions allowing the collection of sub-graphs that potentially capture elementary patterns. The process may be iteratively applied on successive simplified versions of graph B until no new pattern is recognized. Each connected components of initial graph A may further be processed this way, as detailed later. If, at step 4, not all connected components $C_i$ feature the same rigid motion, the subset C is split. This splitting process is to refine the similarity criterion while maintaining as large as possible subsets of arcs.

Figure 14:
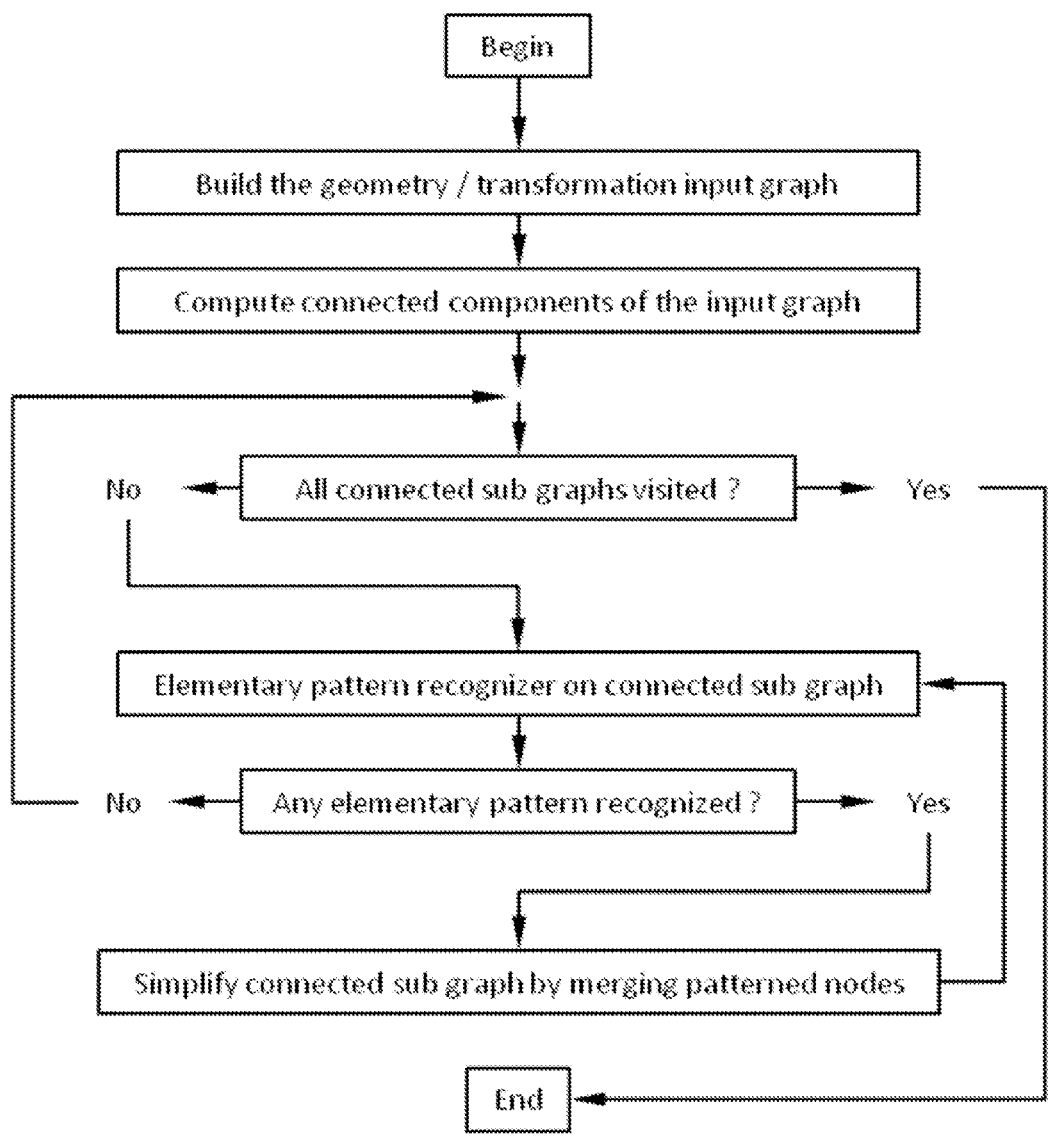
Figure 15:
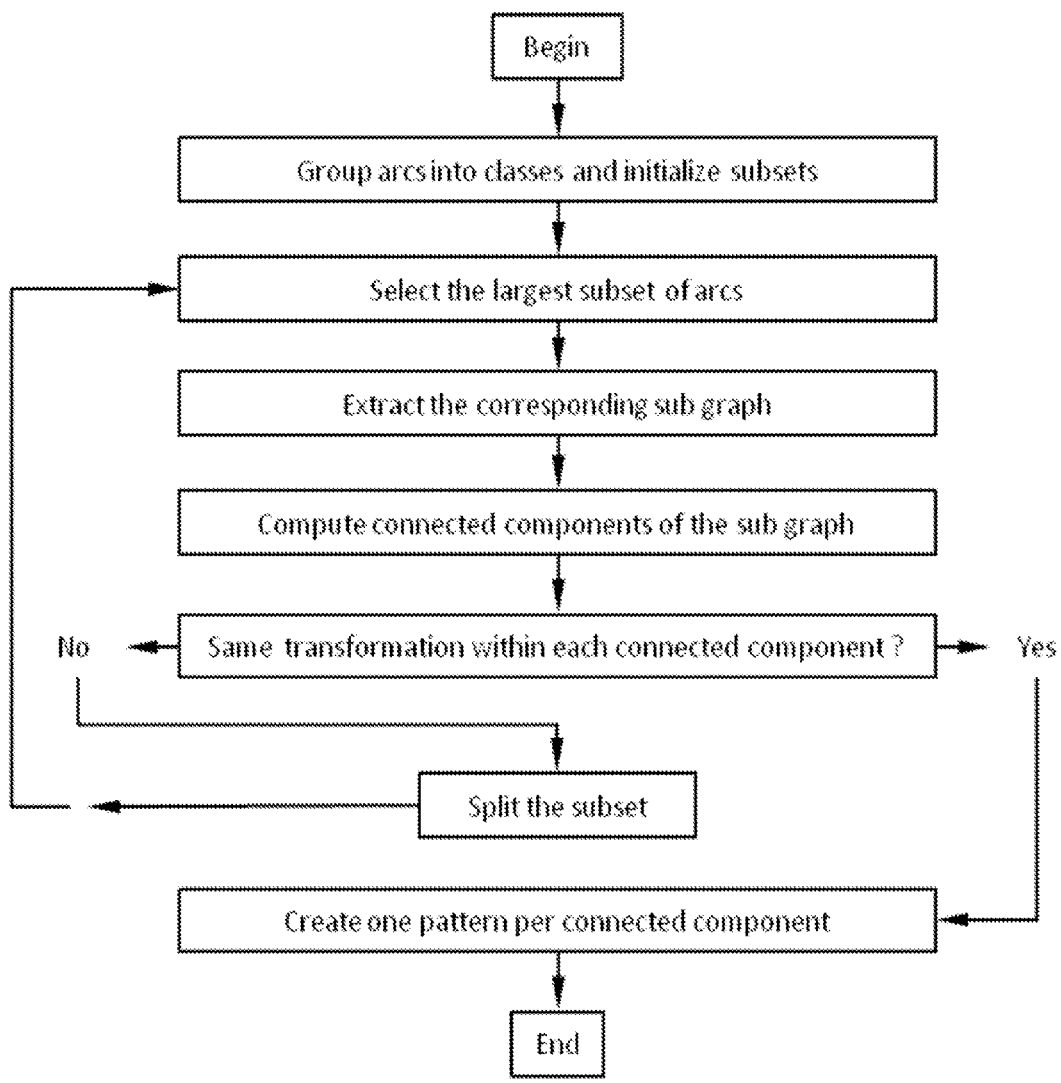

The method in the examples is mainly an iterative process. The core of the algorithm in the examples is the "elementary pattern recognizer" and is iteratively involved in the "pattern of patterns recognizer". Once an elementary is recognized, the input graph is simplified and the recognition is performed again. The pattern of patterns recognizer may run as illustrated in the diagram of FIG. 14. The elementary pattern recognizer may run as described in the diagram of FIG. 15.

An example of the method with an example of a B-Rep is now discussed.

Figure 16:
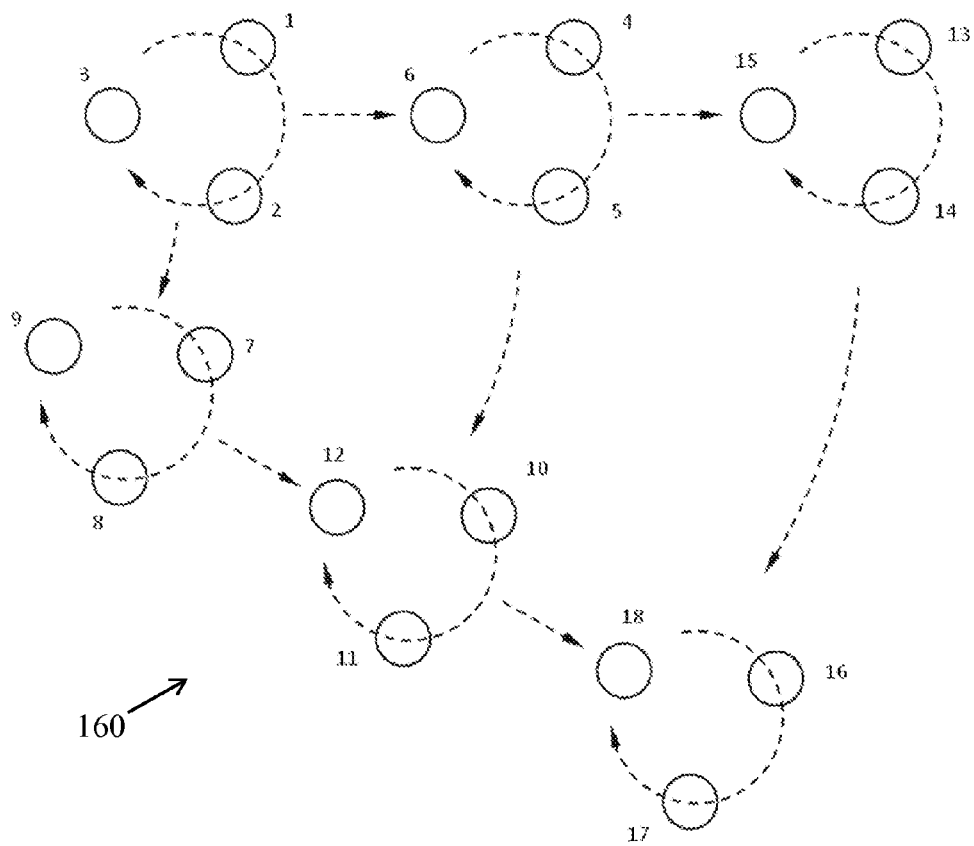

B-Rep 160 of the example comprises a set of eighteen circles (i.e. the faces that are a copy one of another and that are provided at S10 are disks supported by a plane corresponding to the plane of the figure and bounded by the circles) arranged in the plane (for the sake of a simple understanding of the method) as illustrated in FIG. 16. Circles are numbered from 1 to 1. It can be seen that circles 1, 2 and 3 may have been arranged around a crown. This crown may then have been translated twice, and the whole may have been rotated once. This is the history of the design of the B-Rep of the example FIG. 16 that is the most likely according to user intent, at least in the field of mechanical design. A goal of the method is to retrieve this recursive rotation-translation-rotation pattern structure from the input graph of geometries and rigid motions.

Figure 17:
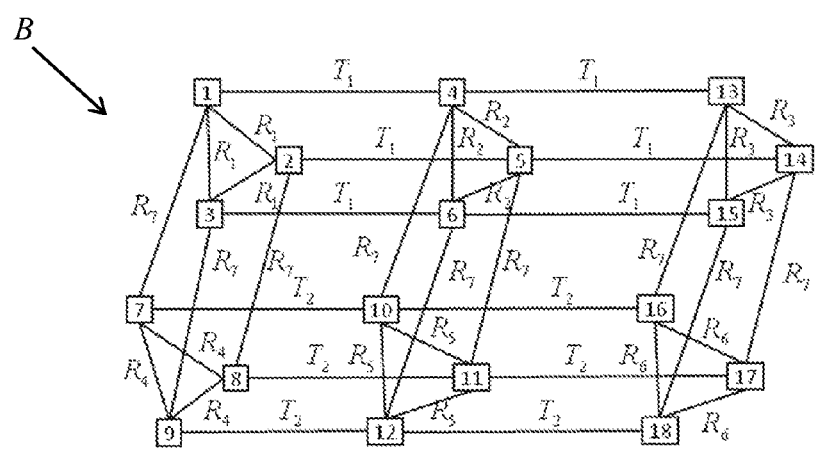

The graph B defined at S20, for example as explained above with reference to FIGS. 9-13, gathering geometries and rigid motions corresponding to the example of FIG. 16, is illustrated on FIG. 17. For simplicity, arcs are not numbered on the drawing because they can be identified by end node numbers. Arcs are labeled with rigid motions. Symbols $T_i$ refer to translations, symbols $R_i$ refer to rotations. For example, through translation $T_1$, circle 4 is a copy of circle 1 as well as circle 14 is a copy of circle 5. Through rotation $R_1$, circle 2 is a copy of circle 1. Circle 10 is a copy of circle 12 through Rotation $R_5$. Despite rotations $R_1$ and $R_5$ have the same 2π/3 angle, they are not identical because they do not have the same center. Also, rigid motions that appear less than three times are also discarded on the figure for the sake of clarity.

An example of the very first step of elementary pattern recognition is to group arcs of graph B into so called "classes" (this is the determining S30). A class gathers arcs according to a similarity criterion that involves the associated rigid motion and the geometrical object. As explained above, the similarity criterion is weaker than strict equality of rigid motions.

An example of implementation of the determining S30 starting from the graph of FIG. 17 is now discussed.

Preliminary definitions are useful. Let $u_i$, i=1, 2 be two arcs, and let $D_i=(R_i,T_i)$, i=1, 2 the rigid motions respectively associated with arcs $u_i$. Formally, $D_i=m(u_i)$. Let $\theta_i$ be the angle of rotation $R_i$ and $A_i$ the axis of rotation $R_i$. Let $x_i=\alpha(u_i)$ be the geometrical object at the origin of arc $u_i$ and $g(x_i)$ its center of gravity.

Figure 18:
Figure 19:
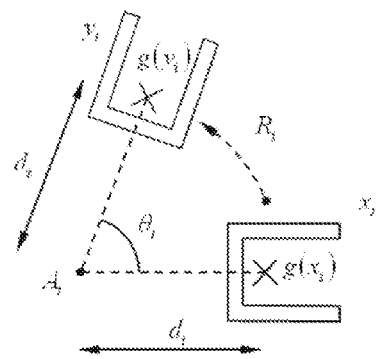

By definition, the radius of arc $u_i$ is the distance $d_i$ between $g(x_i)$ and $A_i$. Same value $d_i$ is obtained by considering $y_i=\omega(u_i)$ the geometrical object at the end of arc $u_i$ instead of $x_i$, as illustrated on FIGS. 18-19.

According to the example of the similarity criterion provided earlier, arcs $u_1$ and $u_2$ are similar when one of the following conditions is true.

1. $D_1$ and $D_2$ are pure translations and their translation vectors have the same length. Formally: $\theta_1=\theta_2=0$ and $|T_1|=|T_2|$.
2. $D_1$ and $D_2$ are not pure translations. Their rotations have the same absolute angle, formally, $|\theta_1|=|\theta_2|\neq 0$. The radii of arcs $u_1$ and $u_2$ are equal, formally $d_1=d_2$.

Arcs $u_1$ and $u_2$ are not similar otherwise.

The method of the example may perform adequate tests to determine similar rigid motions for performing the determining S30.

According to basic algebra, and as already discussed, the similarity relationship being an equivalence relation on the set of arcs, it separates (by theorem) the set of arcs into maximal and disjoint subsets, which may be named "equivalence classes".

Figure 20:
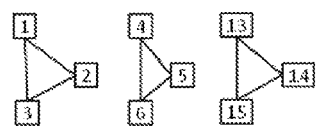
Figure 21:
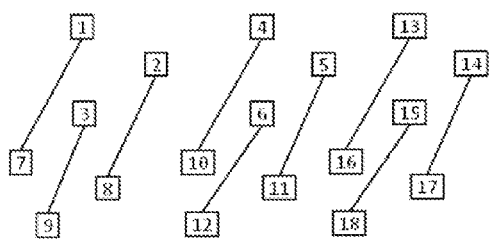
Figure 22:
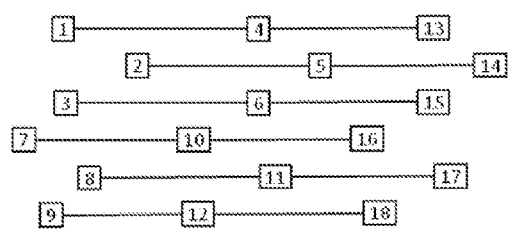

Back to the example, the class computation and sub-graph extraction performed on graph B yield at S30 three maximal sub-graphs shown on FIGS. 20-22. Sub-graph C of FIG. 20, is due to the fact that rotations $R_i$, i=1, . . . , 6 all have the same angle and the same radii (they are not identical since they do not have the same center). It includes 18 arcs. Sub-graph 210 of FIG. 21 comes from rotation $R_7$. It includes 9 arcs. Sub-graph 220 of FIG. 22 comes from the fact that translations $T_1$ and $T_2$ have the same length despite they are not identical. It includes 12 arcs.

An example of the identifying S40, performed after the determining S30 of the maximal sub-graphs C, 210 and 220 of FIGS. 20-22, is now discussed.

Next step is to select the sub-graph featuring the largest number of arcs, which is graph C in the example thanks to its 18 arcs. Graph C includes six connected components $C_{i=1\ldots 6}$. Component $C_1$ includes nodes 1, 2, 3, component $C_2$ includes nodes 4, 5, 6, component $C_3$ includes nodes 7, 8, 9, component $C_4$ includes nodes 10, 11, 12, component $C_5$ includes nodes 13, 14, 15, and component $C_6$ includes nodes 16, 17, 18. All arcs of each connected component are labeled by the same rigid motion: arcs of component $C_1$ are all labeled by rotation $R_1$, arcs of component $C_2$ are all labeled by rotation $R_2$, etc. Consequently, the algorithm of the example may recognize that each connected component is an elementary pattern, which is a small crown of three circles. This is the identifying S40.

Then, the iteration of the method may occur. Graph B is simplified into graph B' by merging nodes of each connected components $C_i$ into a single node, as explained with the example of collapsing provided earlier. Arcs of graph B joining nodes from one component to another may be managed as follows for example. Let $C_i$ and $C_j$ be two distinct components. If there exists a one-to-one mapping between nodes of $C_i$ and nodes of $C_j$ and if all arcs of this mapping are labeled with the same rigid motion D, then the simplified graph B' features one arc connecting the single node $C_i$ and the single node $C_j$, which is labeled with rigid motion D. Otherwise, geometries of $C_i$ are not globally isometric to geometries of $C_j$ and no arc is created in the simplified graph.

Figure 23:
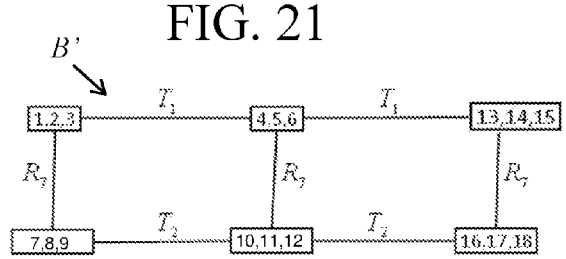

In the example, this yields simplified graph B' of FIG. 23. For readability, the naming of nodes resulting from the merging is based on original nodes numbers on the figure.

Figure 24:
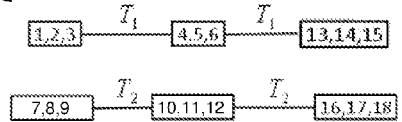
Figure 25:
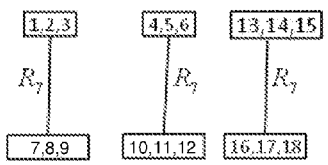

Simplified graph B' may now be the input graph of the next iteration of the algorithm of the example. The equivalence classes computation performed on arcs of B' yields two subsets: C', and 250 as shown on FIGS. 24-25. Sub-graph, noted C', includes four arcs because $|T_1|=|T_2|$ while sub-graph 250 includes three arcs.

Figure 26:
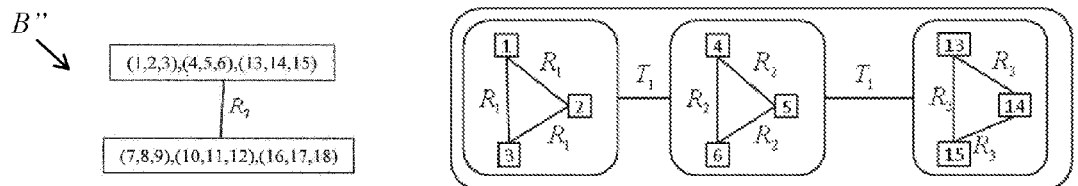

The choice may then be to perform elementary pattern recognition as above on sub-graph C' because it includes the largest number of arcs. This yields two elementary patterns, one for each connected component. Then, graph B' is simplified into graph B" as illustrated in FIG. 26.

The very last iteration of the example is to recognize on graph B" an elementary pattern made of two copies through rotation $R_7$. This iteration is not detailed.

Figure 27:
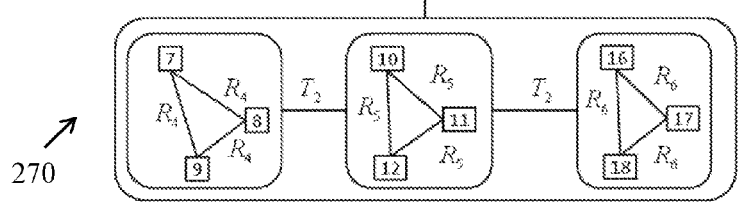

Finally, logic 270 of the recursive pattern structure recognized by the method of the example may be as illustrated on FIG. 27, using the hierarchical graph graphical syntax. The method may thus output data indicating that the set of faces of B-Rep 160 provided at S10 follows logic 270, the logic being hierarchical data representing the full pattern of patterns structure of the B-Rep.

In the example provided with reference to FIGS. 16-27, the identifying S40 is always performed by simply selecting, within the sub-graphs determined at S30, the sub-graph having the highest number of arcs. Indeed, in this example, the connected components of the selected sub-graph (including $C_{i=1\ldots 6}$, connected components of graph C' of FIG. 24 and then the single connected component of B" of FIG. 26) always all respect the identity criterion.

This is however not necessarily true in the general case. The method may thus be improved and output less "false results" by accounting for special cases where this is not true. This may be done as follows.

The identifying S40 may comprise, as above, selecting, within the determined sub-graphs, the sub-graph having the highest number of arcs. However, the identifying S40 may also comprise testing whether the rigid motions represented by the arcs of each of the connected components of the selected sub-graph all respect the identity criterion. In other words, the connected components of the sub-graph having the highest number of arcs (all arcs thus being 'similar', i.e. representing rigid motions that are similar) are considered. And the method actually tests (as classical from the field of computer science), whether or not each connected component thus considered individually (i.e. one-by-one) is composed only of arcs that are actually identical (i.e. represent identical rigid motions).

As a result of the testing, different strategies may be followed to identify the correct set of connected components and thereby end the method. One way simple to implement is to perform a splitting procedure as explained below.

In the splitting procedure, the identifying S40 further comprises, as a result of the testing, the following action. If the result of the testing is positive (i.e. all connected components of the selected sub-graph each respect the identity criterion), then the method identifies the set of connected components as the connected components of the selected sub-graph (i.e. the connected elements of the selected sub-graph form the set output by the identifying step S40). This is actually always the situation in the example of FIGS. 16-27. However, else, i.e. if the result of the testing is negative, then the method performs a splitting of the selected sub-graph and re-runs the selecting and the testing. The splitting consists of modifying the selected sub-graph by breaking the selected sub-graph toward a state where the result of the testing procedure, if re-run, is more likely to be positive. This allows eventually ending the iteration.

In an example that converges fast and respects the design, the splitting comprises cutting, from the selected sub-graph, the arcs of a sub-graph of the selected sub-graph that may be called "cut sub-graph" for the sake of convenience. The cut sub-graph is, among all sub-graphs of the selected sub-graph, the one that has the highest number of arcs and for which the rigid motions represented by the arcs all respect the identity criterion. Cases where several such sub-graphs exist (i.e. equal number of arcs) may be handled in any way. Then the splitting also comprises creating a new sub-graph with the cut arcs.

This is detailed below, via an example.

The splitting process of the example is run in the following conditions. Let graph B be a connected component of input graph A. The classes computation determines at S30 a partition of arcs of B into subsets. Graph C is the sub-graph of B defined by the largest subset. Sub graphs $C_i$ are connected components of C. There is at least one of these, noted $C_0$, and two arcs u, v of $C_0$ such that the associated rigid motions m(u) and m(v) are not equal.

The splitting process of the example then runs as follows. Given $C_0$ as defined previously, the first step is to identify all distinct rigid motions associated to arcs of $C_0$, noted $D_i$, i=1, . . . , n. The number n of rigid motions is generally smaller than the number of arcs in $C_0$ because several arcs may be associated to the same rigid motion. The second step is to group arcs of $C_0$ according to shared rigid motions. Formally, for i=1, . . . , n, $U_i$ is the subset of arcs of $C_0$ such that for all u∈$U_i$, m(u)=$D_i$, in short, $U_i$=$m^{-1}$ ($D_i$). Now, let G ($U_i$) the sub graph of $C_0$ defined by arcs in $U_i$. Next step is to consider all combinations of these sub-graphs. Each subset Q⊂{1, . . . , n} defines such a combination by $$K(Q) = G\left(\bigcup_{i \in Q} U_i\right)$$

Next step is to select, among all Q⊂{1, . . . , n}, the combination K(Q) having the largest number of arcs and such that, for each connected component of K(Q), all arcs are associated to the same rigid motion. Note Q* the subset of {1, . . . , n} featuring this property. The splitting operation is to replace, in the subsets partition, the subset of $C_0$ arcs by the subset $U_{i \in Q^*} U_i$ and its complementary subset $U_{i \in \{1, \ldots, n\} - Q^*} U_i$.

In other words, the splitting cuts from the selected sub-graph its largest sub-sub-graph with arcs representing rigid motions that respect the identity criterion ("largest" in terms of the number of arcs). Then, the selection is performed again on the modified version of the set of maximal sub-graphs initially determined at S30, and then the splitting may be performed again since the testing is also performed again. Eventually, the result will necessarily be a selected sub-graph having only connected components with identical arcs, such that the algorithm converges. Of course, the result(s) of the splitting may be stored so that, when the method is iterated, at next iterations of the determining (S30) and the identifying (S40), the splitting may be performed faster if the input elements are the same (e.g. the sub-graph to be splitted is the same).

Figure 28:
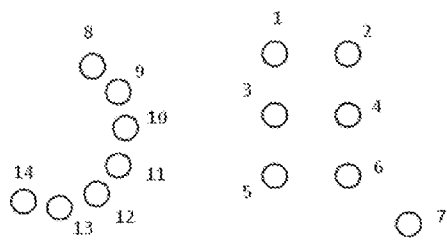

FIG. 28 exemplifies a situation where the splitting operation is preferable and helps avoiding a false result. The B-Rep provided at S10 in this example includes a partial crown made of seven circles equally spaced (numbered 8 to 14), a grid of six circles (numbered 1 to 6) and an extra circle (numbered 7) unaligned with the grid.

Figure 29:
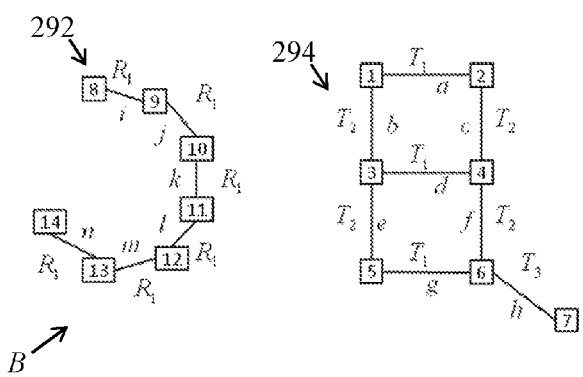

Graph B corresponding to this geometry and defined at S20 is provided on FIG. 29. The numbering of vertices is self-explanatory. Arcs are named by letters "a" to "n" and are labeled with associated rigid motions. Translation vectors have the same length: $|T_1|=|T_2|=|T_3|$.

Clearly, graph B features two connected components 292 and 294, as illustrated on FIG. 29. The classes computation performed on arcs of graph B yields two subsets {i, j, k, l, m, n} and {a, b, c, d, e, f, g, h}, the largest subset being the second one. So, sub graph C is defined by vertices 1 to 7 and arcs a to h. Since this sub graph is connected, it is equal to $C_0$.

The splitting process is required because not all arcs of $C_0$ are associated with the same rigid motion. For example, arc a is associated with translation $T_1$ while arc b is associated with translation $T_2$ which is not equal to $T_1$. This is written m(a)=$T_1 \neq T_2$=m(b). The first splitting step identifies n=3 rigid motions associated to arcs of $C_0$ which are $T_1$, $T_2$, $T_3$. Grouping arcs by rigid motion yields:

$U_1 = m^{-1}(T_1) = \{a,d,g\}$ $U_2 = m^{-1}(T_2) = \{b,c,e,f\}$ $U_3 = m^{-1}(T_3) = \{h\}$

Figure 30:
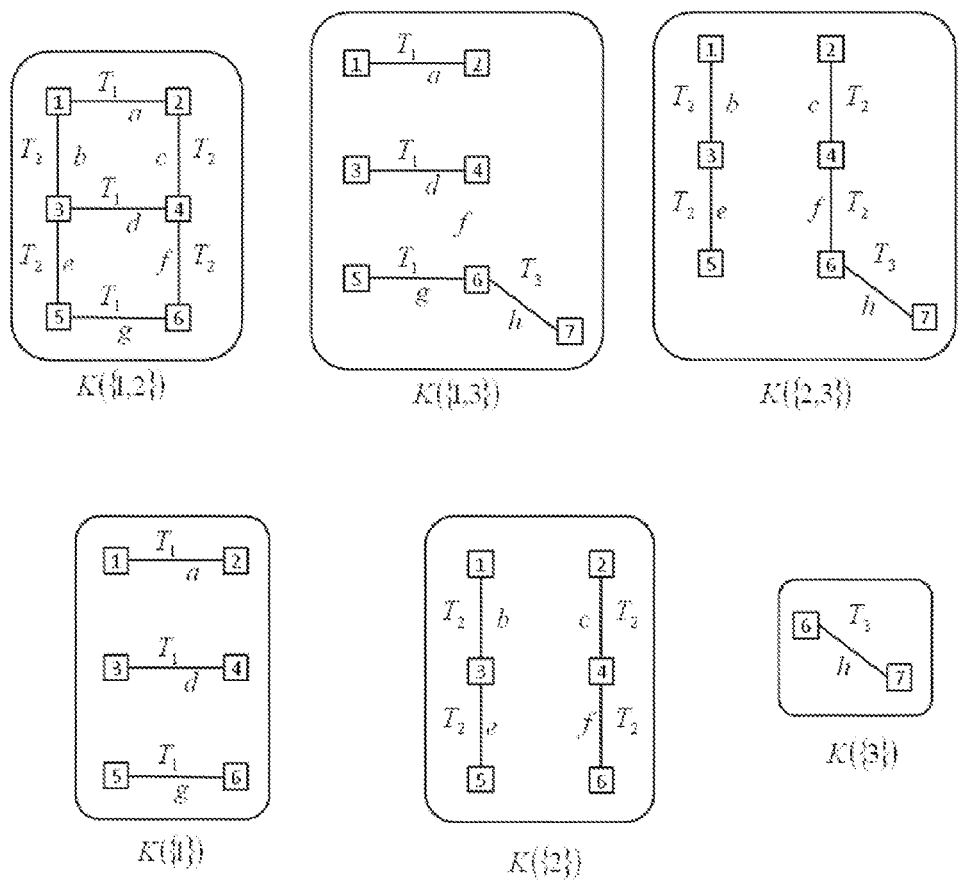

Now, investigating all subsets Q⊂{1,2,3} is to check sub graphs $K(\{1,2\}) = G(U_1 \cup U_2) = G(\{a,b,c,d,e,f,g\})$ $K(\{1,3\}) = G(U_1 \cup U_3) = G(\{a,d,g,h\})$ $K(\{2,3\}) = G(U_2 \cup U_3) = G(\{b,c,e,f,h\})$ $K(\{1\}) = G(U_1) = G(\{a,d,g\})$ $K(\{2\}) = G(U_2) = G(\{b,c,e,f\})$ $K(\{3\}) = G(U_3) = G(\{h\})$ Graph K({1,2,3}) is not relevant because it is $C_0$ itself. Graph K(∅) is not relevant because it is empty. FIG. 30 illustrates sub-graphs K(Q). Clearly, the property (all arcs of each connected component are associated with the same rigid motion) is satisfied by graphs K({1}), K({2}) and K({3}) and not by any other graph. The largest one (in terms of number of arcs) being K({2}). So, the splitting separates subset {a, b, c, d, e, f, g, h} into {b, c, e, f} and {a, d, g, h}.

Next step is the iteration on this new subsets repartition to find the largest subset, which is now {i, j, k, l, m, n}. The algorithm identifies the corresponding elementary pattern because all arcs of the corresponding sub graph are associated to the same rigid motion: $R_1$. The remaining largest subset is {b, c, e, f} is managed at next iteration, after nodes collapsing. Indeed, the collapsing may be performed after the splitting the same way as described before.

While this invention has been particularly shown and described with references to example embodiments thereof, it will be understood by those skilled in the art that various changes in form and details may be made therein without departing from the scope of the invention encompassed by the appended claims.

What is claimed is:

1. A computer-implemented method for designing a three-dimensional modeled object comprising:
   in computer memory, providing geometrical elements that represent the modeled object and that include a set in which the geometrical elements are a copy one of another;
   by a processor:
   defining a graph having nodes, that each represent a geometrical element of the set, and arcs, that each connect a pair of nodes and represent a rigid motion which transforms the geometrical element represented by one node of the pair into the geometrical element represented by the other node of the pair;
   determining maximal sub-graphs of the graph for which the rigid motions represented by the arcs all respect a predetermined similarity criterion, the similarity criterion being a criterion that indicates that two rigid motions are similar, but not identical in the way they operate on a geometrical object, such that the similarity criterion is weaker than a predetermined identity criterion;
   identifying, within the determined sub-graphs, a set of connected components having a highest number of arcs and for which the rigid motions represented by the arcs all respect the identity criterion, the connected components of the set having nodes;
   modifying the graph by collapsing the nodes of each connected component of the identified set of connected components: and
   repeating the determining and the identifying on the modified graph, the identified sets of connected components forming a pattern of patterns structure of geometrical elements, the method then further comprising:
   presenting, to a user, the pattern of patterns structure, and performing, by user-interaction, at least one design action on the presented structure, the at least one design action being performed in an automatically unified way with respect to the presented structure.

2. The method of claim 1, wherein the method further comprises iterating the following:
   modifying the graph by collapsing the nodes of each connected component of the identified set of connected components; and
   repeating the determining and the identifying on the modified graph.

3. The method of claim 2, wherein the collapsing comprises:
   deleting all arcs connected to any node of any connected component of the identified set of connected components;
   replacing, for each respective connected component, all nodes of the respective connected component by a single node; and
   adding arcs between pairs of nodes representing connected components that are isometric, each added arc representing the rigid motion which transforms the connected component represented by one node of the pair into the connected component represented by the other node of the pair.

4. The method of claim 1, wherein the identifying comprises:
   selecting, within the determined sub-graphs, the sub-graph having the highest number of arcs;
   testing whether the rigid motions represented by the arcs of each of the connected components of the selected sub-graph all respect the identity criterion.

5. The method of claim 4, wherein the identifying further comprises, as a result of the testing:
   if the result of the testing is positive, identifying the set of connected components as the connected components of the selected sub-graph;
   else, if the result of the testing is negative, splitting the selected sub-graph and re-running the selecting and the testing.

6. The method of claim 5, wherein the splitting comprises:
   cutting, from the selected sub-graph, the arcs of the sub-graph of the selected sub-graph that, among all sub-graphs of the selected sub-graph, has the highest number of arcs and for which the rigid motions represented by the arcs all respect the identity criterion; and
   creating a new sub-graph with the cut arcs.

7. A computer program product executed by at least one processor in communication with memory, the computer program product comprising:
   a non-transitory computer readable medium, the computer readable medium comprising program instructions for designing a three-dimensional modeled object the program instructions, when executed by the at least one processor cause:
   providing geometrical elements that represent the modeled object and that include a set in which the geometrical elements are a copy one of another;
   defining a graph having nodes, that each represent a geometrical element of the set, and arcs, that each connect a pair of nodes and represent a rigid motion which transforms the geometrical element represented by one node of the pair into the geometrical element represented by the other node of the pair;
   determining maximal sub-graphs of the graph for which the rigid motions represented by the arcs all respect a predetermined similarity criterion, the similarity criterion being a criterion that indicates that two rigid motions are similar, but not identical in the way they operate on a geometrical object, such that the similarity criterion is weaker than a predetermined identity criterion;
   identifying, within the determined sub-graphs, a set of connected components having a highest number of arcs and for which the rigid motions represented by the arcs all respect the identity criterion, the connected components of the set having nodes;
   modifying the graph by collapsing the nodes of each connected component of the identified set of connected components; and
   repeating the determining and the identifying on the modified graph, the identified sets of connected components forming a pattern of patterns structure of geometrical elements, the method then further comprising:
   presenting, to a user, the pattern of patterns structure, and performing, by user-interaction, at least one design action on the presented structure, the at least one design action being performed in an automatically unified way with respect to the presented structure.

8. A CAD system comprising a processor coupled to a memory and a graphical user interface, the memory having recorded thereon a computer program comprising instructions for performing a computer-implemented method for designing a three-dimensional modeled object comprising:

provideing geometrical elements that represent the modeled object and that include a set in which the geometrical elements are a copy one of another;

defining a graph having nodes, that each represent a geometrical element of the set, and arcs, that each connect a pair of nodes and represent a rigid motion which transforms the geometrical element represented by one node of the pair into the geometrical element represented by the other node of the pair;

determining maximal sub-graphs of the graph for which the rigid motions represented by the arcs all respect a predetermined similarity criterion, the similarity criterion being a criterion that indicates that two rigid motions are similar, but not identical in the way they operate on a geometrical object, such that the similarity criterion is weaker than a predetermined identity criterion;

identifying, within the determined sub-graphs, a set of connected components having a highest number of arcs and for which the rigid motions represented by the arcs all respect the identity criterion, the connected components of the set having nodes;

modifying the graph by collapsing the nodes of each connected component of the identified set of connected components; and repeating the determining and the identifying on the modified graph, the identified sets of connected components forming a pattern of patterns structure of geometrical elements, the method then further comprising:

presenting, to a user, the pattern of patterns structure, and performing, by user-interaction, at least one design action on the presented structure, the at least one design action being performed in an automatically unified way with respect to the presented structure.

* * * * *